(12) United States Patent
Stecher et al.

(10) Patent No.: US 7,888,794 B2
(45) Date of Patent: Feb. 15, 2011

(54) SEMICONDUCTOR DEVICE AND METHOD

(75) Inventors: Matthias Stecher, Munich (DE); Tobias Smorodin, Puchheim (DE)

(73) Assignee: Infineon Technologies AG, Neubiberg (DE)

( * ) Notice: Subject to any disclaimer, the term of this patent is extended or adjusted under 35 U.S.C. 154(b) by 431 days.

(21) Appl. No.: 12/032,760

(22) Filed: Feb. 18, 2008

(65) Prior Publication Data
US 2009/0206420 A1 Aug. 20, 2009

(51) Int. Cl.
*H01L 21/00* (2006.01)
*H01L 23/34* (2006.01)

(52) U.S. Cl. ............... 257/713; 257/712; 257/E23.101; 257/E21.499

(58) Field of Classification Search ................. 257/712, 257/713; 438/122
See application file for complete search history.

(56) References Cited

U.S. PATENT DOCUMENTS

| 5,650,340 A | 7/1997 | Burr et al. |
| 6,503,786 B2 | 1/2003 | Klodzinski |

FOREIGN PATENT DOCUMENTS

| WO | 0213235 | 2/2002 |

OTHER PUBLICATIONS

Khemka, Vishnu et al., "Detection and Optimization of Temperature Distribution Across Large-Area Power MOSFETs to Improve Energy Capability," IEEE Transactions on Electron Devices, vol. 51, No. 6, pp. 1025-1032 (Jun. 2004).
Smorodin, Tobias et al., "Investigation and Improvement of Fast Temperature-Cycle Reliability for DMOS-Related Conductor Path Design," 6 pgs. (Date unknown).

*Primary Examiner*—David A Zarneke
(74) *Attorney, Agent, or Firm*—Dicke, Billig & Czaja, PLLC

(57) ABSTRACT

A semiconductor device and method is disclosed. One embodiment provides an active region in a semiconductor substrate, including a first terminal region and a second terminal region. wherein the active region is interrupted by an inactive region, wherein an electrical power dissipation in the inactive region is zero or smaller than an electrical power dissipation in the active region; and a metallization layer arranged with respect to the active region on a surface of the semiconductor device and at least partly overlapping the active area, wherein the metallization layer is divided into a first part, in electrical contact to the first terminal region, and a second part, in electrical contact to the second terminal region, wherein the first and the second part are separated by a gap; and wherein the gap and the inactive region are mutually arranged so that an electrical power dissipation below the gap is reduced compared to an electrical power dissipation below the first part and the second part of the metallization layer.

24 Claims, 16 Drawing Sheets

Producing an active region in a semiconductor substrate, wherein the active region is interrupted by an inactive region, and wherein an electrical power dissipation in the inactive region is zero or smaller than an electrical power dissipation in the active region ~140

Applying a metallization layer arranged with respect to an active region on a surface of the semiconductor device, wherein the metallization layer is divided into a first part and a second part, wherein the first and the second part are separated by a gap; and wherein the applying is performed so that the gap and the inactive region is mutally arranged so that therewith an electrical power dissipation below the gap is reduced compared to an electrical power dissipation below the first and the second part of the metallization layer ~145

FIG 13

SEMICONDUCTOR DEVICE AND METHOD

BACKGROUND

One or more embodiments relate to a semiconductor device, for example, a power semiconductor device with a reduced temperature swing and a reduced temperature gradient, and a method for manufacturing the semiconductor device.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2b illustrates the derivation of the temperature profiles illustrated in FIG. 2a.

FIG. 8b illustrates another embodiment of the DMOS transistor illustrated in FIG. 8a.

FIG. 8c illustrates a further embodiment of the DMOS transistor illustrated in FIG. 8a.

FIG. 13 illustrates a flow chart of the method of manufacturing a power semiconductor device according to one embodiment.

DETAILED DESCRIPTION

Figure 1:
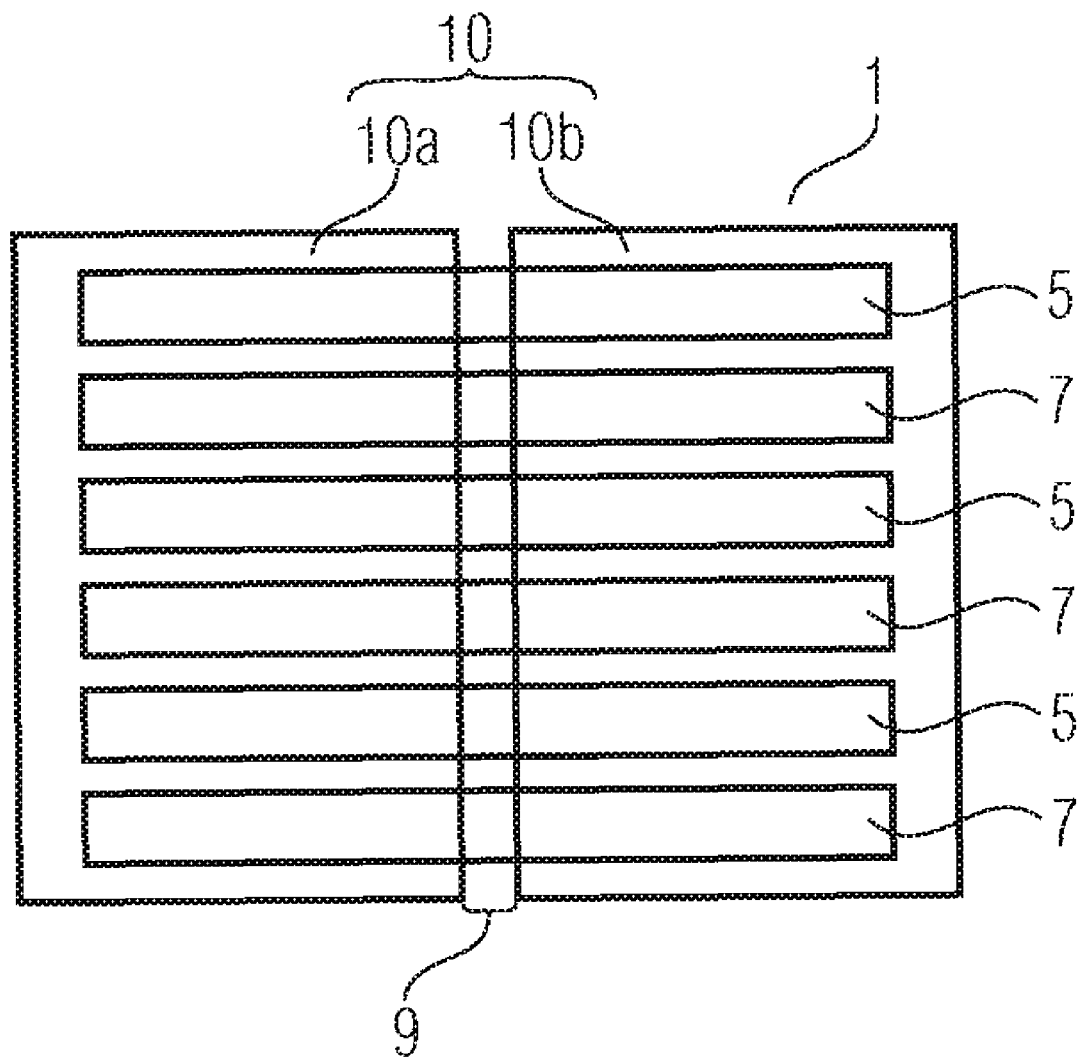
FIG. 1 illustrates a schematic top view drawing of a conventional power semiconductor device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

With reference to the accompanying FIGS. 1 to 13, explanations and embodiments relating to a power semiconductor device with a reduced temperature swing and a reduced temperature gradient, and to a method for producing the same are given.

During operation of a power semiconductor device, for example, a double diffused metal oxide semiconductor (DMOS) transistor can be objected to severe temperature changes. This temperature swing can be cyclical and is sometimes termed as repetitive clamping. Depending on the power semiconductor device, severe temperature changes may be termed differently, for example, power cycling for an isolated gate bipolar transistor (IGBT) or active cycling for single transistors. More general, the power device may undergo short and severe temperature changes or power cycle stress, which can be the result of short electrical pulses, e.g., introduced by an inductive current in the power device. The current of an inductive load, for example, a relay or magnetic valve, can be regulated by switching units having power semiconductor devices. During the switching, a dissipation of the inductive energy in the switching unit may occur. This can lead to a strong temperature increase, and hence to a high temperature swing of the power semiconductor device. In an application, this temperature swing may occur cyclically and can result in thermo-mechanical stress for the power semiconductor device. The temperature swing can be up to 150° C., for example. The resulting thermo-mechanical stress can cause a viscoplastic or plastic deformation of metallization layers in the power semiconductor device. At a certain yield point or yield strength, a metallization layer begins to plastically deform. Prior to the yield point, the metal layer will deform elastically and will return to its original shape when the applied stress is removed. Above a certain yield point; the deformation of the metallization is irreversible. During a plastic deformation of a metallization layer in the power semiconductor device, the mechanical stress in the metallization layer increases only marginally, but a severe change of the strain can be observed. Because of the viscoplastic deformation of the metal layer, the local stress, for example, on an interlayer dielectric (ILD) layer of the power device increases and beyond a critical limit, the ILD may crack. An electric short circuit caused by extruding metal may be the consequence and because of that a breakdown of the power semiconductor device. The viscoplastic deformation of metallization layers in the power semiconductor device is not initiated in the center of the power semiconductor device, which may include the maximum temperature during operation, but rather at a region exhibiting the maximum temperature gradient. The viscoplastic deformation is propagating from this region to the center of the power semiconductor device, depending on the exact layout of the metallization layer. This means that the location of the maximum temperature gradient can be the starting point of the viscoplastic deformations of the metal layer. The higher the temperature swing in the center of the power semiconductor device is, the faster may the deformation propagate to the center and the more evident the deformation will be.

In order to reduce the temperature swing of a power semiconductor device during operation, a thick metallization layer, for example, a power copper layer, can be deposited on the upper surface of the power semiconductor device. This thick metallization layer is on the one hand configured to improve the heat dissipation caused by the power semiconductor device during operation and on the other hand capable to conduct high currents, which may be needed for applications of the power semiconductor devices. Such a thick metallization layer can include copper, but also other metals. In the following, the metallization layer on the upper surface of the power semiconductor device will also be named power copper layer or power copper metallization layer.

A conventional approach to reduce the mechanical forces at the maximum temperature gradient and the deformation consists in the reduction of the temperature swing during the operation of the power semiconductor device to a small region between 40° C. to 80° C. As a consequence of the conventional approach, the area of the power semiconductor device may be increased, and the minimum size of the power semiconductor device may be related to the thermal behavior and boundary conditions, although the specific area resistance (Rdon) would allow an area reduction of the power semiconductor device.

The heating of a power semiconductor device may, for example, occur during a normal operation of the device, during an external heating or a heating due to turning on or off the power device. The power semiconductor device can be switched on or off, and the switching may be performed periodically or cyclically. The switching may lead to a heating or temperature swing of the power semiconductor device.

FIG. 1 illustrates the top view of a conventional power semiconductor device 1, in this case a DMOS transistor, for example. The DMOS transistor 1 has at the topmost surface a power copper layer 10, which is separated in a first part 10a and a second part 10b, wherein both parts are separated by a gap 9. The first metallization layer part 10a may be the part which is connected to the parallel arranged source regions 5 of the DMOS transistor formed in the semiconductor substrate. The second part 10b of the metallization layer 10 may be the drain part, which is connected to the drain terminal region 7 of the DMOS transistor arranged in parallel to the source stripes 5 in the semiconductor substrate. The DMOS transistor 1 has an active area in a semiconductor substrate. This active area may have a plurality of source terminal regions 5, a plurality of drain terminal regions 7 and a plurality of controllable regions (not illustrated in FIG. 1) between the source terminal region and the drain terminal region. The controllable region may have a channel region in the semiconductor substrate separated by an insulating layer or a gate oxide, gate terminal region, which is overlapping the channel region. The DMOS field-effect-transistor (DMOS-FET) may be formed in a silicon substrate or any other semiconductor substrate suitable for forming a power semiconductor device. Between the source terminal regions 5 and the drain terminal regions 7 and the respective parts 10a and 10b of the metallization layer 10 may be a plurality of other conductive and/or insulating layers arranged, which are not illustrated in FIG. 1. In one embodiment, there will be means, for example, vias, in order to form a conductive path from the power copper metallization layer 10, which is arranged on the upper surface of the DMOS, to the respective source and drain terminals regions 5 and 7.

Figure 2A:
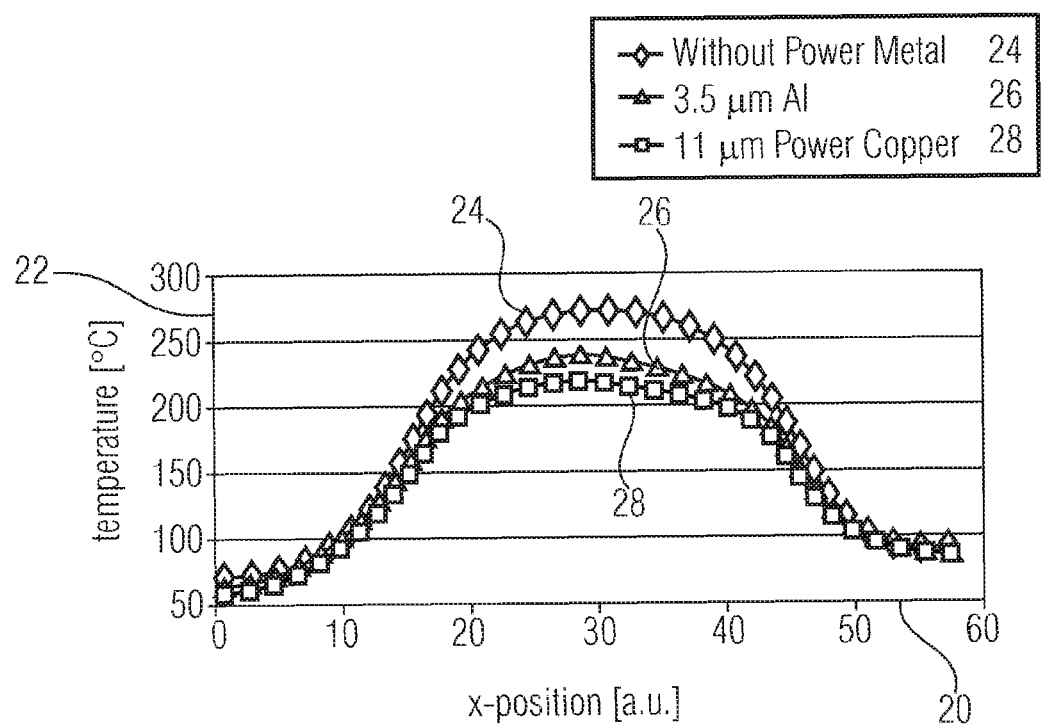
FIG. 2a illustrates the measurement of the temperature distribution of an active heated double diffused metal oxide semiconductor (DMOS) transistor for different metallization layers above the active area of the DMOS.

FIG. 2a illustrates the measurement of a temperature distribution of an active heated DMOS-FET, depending on the thickness of the metallization layer 10 (FIG. 1) on top of the DMOS-FET. The x-axis 20 illustrates the cross-sectional position in the power semiconductor device in arbitrary units, and the y-axis 22 illustrates the measured temperature in ° C. FIG. 2a illustrate three measurement curves: curve 24 illustrates a DMOS transistor without power metal layer 10, curve 26 illustrates a DMOS transistor with a power metal layer made of aluminum with a thickness of 3.5 µm and curve 28 illustrates the DMOS transistor with a power copper metallization layer 10 of a thickness of 11 µm. The measurement curves 24, 26 and 28 clearly reveal that the maximum temperature is reached in a center part of the DMOS transistor. In other words, the maximum temperature swing is in the center part of the power semiconductor device. Furthermore, it is evident from FIG. 2a that the material of the topmost metallization layer and the thickness of the same affect the temperature swing during heating. In this example, the 11 µm thick power copper layer can reduce the temperature swing most, compared to the aluminum layer and the device without any metal layer.

Figure 2B:
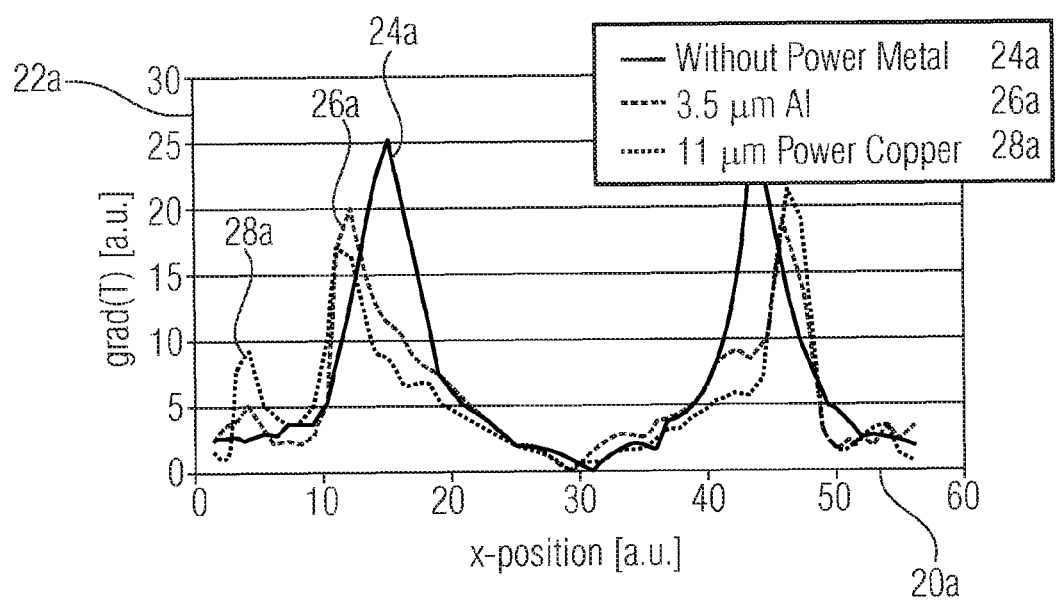

FIG. 2b illustrates the derivation of the measurements of the temperature distribution from FIG. 2a. The y-axis 22a illustrates the gradient of the temperature in arbitrary units. The x-axis 20 illustrates again the lateral position in the active heated area of the DMOS transistor in arbitrary units. The gradient curves 24a, 26a and 28a illustrate that the metallization layer on top of the active heated area causes besides the lowering of the maximum temperature swing also a reduction of the maximum temperature gradient grad(T). The maximum reduction of the temperature gradient is in this example achieved with the 11 µm thick power copper metallization layer (curve 28a).

It is desirable to further reduce the maximum temperature swing of a power semiconductor device in the center part of the device. The center part of the device may exhibit the highest temperature swing during the operation or during switching on or off the device compared to other parts of the power semiconductor device. The heating, the temperature increase of the power semiconductor device respectively, may be caused by an electrical power dissipation of the power semiconductor device. The electrical power dissipation may arise from an active area of the power semiconductor device. The active area may, for example, include a first terminal region, a controllable region and a second terminal region.

Figure 3A:
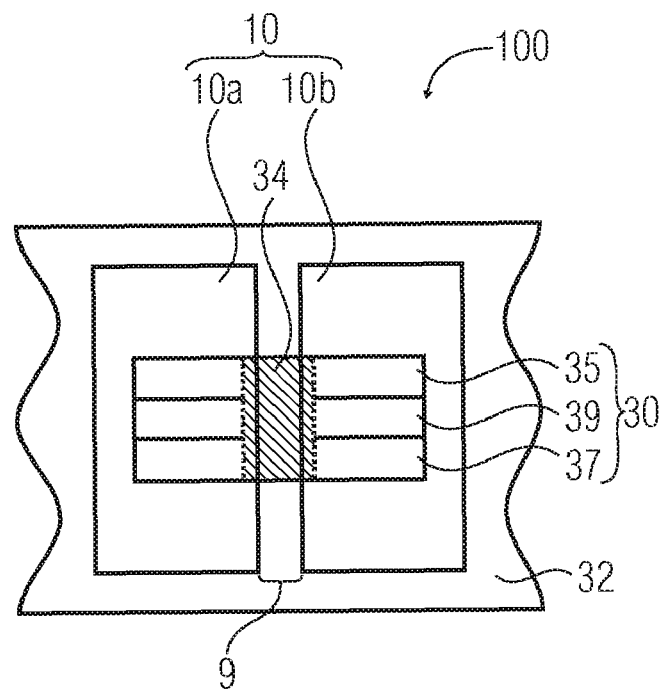
FIG. 3a illustrates a schematic top view of a power semiconductor device according to one embodiment.

FIG. 3a illustrates schematically a power semiconductor device according to one embodiment. A semiconductor device 100 has an active region 30 in a semiconductor substrate 32, wherein the active region 30 has a first terminal region 35, and a second terminal region 37. The active region 30 is interrupted by an inactive region 34, wherein an electrical power dissipation in the inactive region 34 is zero or smaller than an electrical power dissipation in the active region 30. In addition, the semiconductor device 100 includes a metallization layer 10 arranged with respect to the active region 30 on a surface of the semiconductor device 100 and at least partly overlapping the active area 30, wherein the metallization layer 10 is divided into a first part 10a in electrical contact (not illustrated in FIG. 3a) to the first terminal region 35 and a second part 10b in electrical contact to the second terminal region 37. The first 10a and the second part 10b of the metallization layer 10 are separated by a gap 9. The gap 9 and the inactive region 34 are mutually arranged so that an electrical power dissipation below the gap 9 is reduced compared to an electrical power dissipation below the first part 10a and the second part 10b of the metallization layer 10. Moreover the semiconductor device 100 may include a controllable region 39.

The metallization layer 10, which is arranged with respect to the active region on a surface of the semiconductor device, can be arranged above or below the active region. This means that the metallization layer can be arranged, for example, above the active region on an upper surface of the semiconductor device. In other words the metallization layer 10 can be arranged on the upper side of the semiconductor device. In another embodiment the metallization layer 10 may be arranged at the bottom side of the semiconductor device. The metallization layer can be arranged on the opposite side of the main semiconductor substrate side. Next to the main semiconductor surface side, the first and the second terminal region may be formed in the semiconductor substrate.

The semiconductor device 100 may be a power semiconductor device, for example, a lateral DMOS transistor, a vertical DMOS transistor, a trench DMOS transistor (TDMOS), an isolated gate bipolar transistor (IGBT) or a bipolar npn- or pnp transistor, a vertical n- or p-channel metal-oxide semiconductor (NMOS, PMOS) or a super junction MOSFET. The semiconductor device 100 may be manufactured in a silicon substrate, in a silicon carbide substrate, in an indium phosphide substrate, in a gallium arsenide substrate or in a gallium nitride substrate. It is also possible that the semiconductor device can be manufactured in another semiconductor substrate suitable for the fabrication of such a power semiconductor device.

The semiconductor device 100 may have a plurality of active regions, wherein at least one active region is interrupted by an inactive region. An active region of the power semiconductor device may have, during operation or during a switching-on and switching-off phase of the power semiconductor device a higher current flux than in an inactive region. An active region 30 may include a plurality of inactive regions 34. A power dissipation of the power semiconductor device may take place in the active region by a current flux from the first terminal region to the second terminal region or vice versa. The current may flow from the first terminal region through the controllable region to the second terminal region or vice versa.

In one or more embodiments, the first terminal region may be a source terminal region, the controllable region may be a channel region, which can possess a gate terminal region separated by an insulating layer from the channel region, so that the current flux or current through the channel region can be controlled by the gate terminal region. In other words, the active region can be the active region of a field-effect transistor (FET). The exact geometrical arrangement of the active area with the source terminal region, the controllable region and the drain terminal region in the semiconductor substrate may differ in one or more embodiments.

The metallization layer 10 on the upper surface of the power semiconductor device 100 is separated into a first part 10a and 10b, wherein the two parts are separated by a gap 9 which may exhibit a width between 1 µm and 100 µm. The first 10a and the second part 10b may be electrically connected to the respective source and drain terminal regions of the power semiconductor device 100. The metallization layer 10 can be configured to dissipate heat caused by an electrical power dissipation of the active region. Furthermore, the first and the second part of the metallization layer may act as a power supply layer for the first and the second terminal region, the source and the drain region respectively.

In an integrated circuit chip (IC), the first and the second metallization layer part may be bonded, so that the respective power for the device can be applied. The connection of the first and the second part of the metallization layer with the respective first and second terminal region may be performed with vias and further metallization layers, which can be arranged between the main surface of the semiconductor substrate 32 and the power copper metallization layer 10 on the upper surface of the power semiconductor device 100. Those layers and VIAs, in general means for forming a conductive path between the metallization layer 10 and the first and the second terminal region are not illustrated in FIG. 3a.

The gap 9 between the first 10a and the second 10b metallization layer part and the inactive region 34 are mutually arranged so that an electrical power dissipation below the gap 9 is reduced compared to an electrical power dissipation below the first 10a and the second part 10b of the metallization layer 10. As it is illustrated in FIG. 3a, the gap and the inactive region can be mutually arranged, so that the gap 9 and the inactive region at least partly overlap.

Figure 3B:
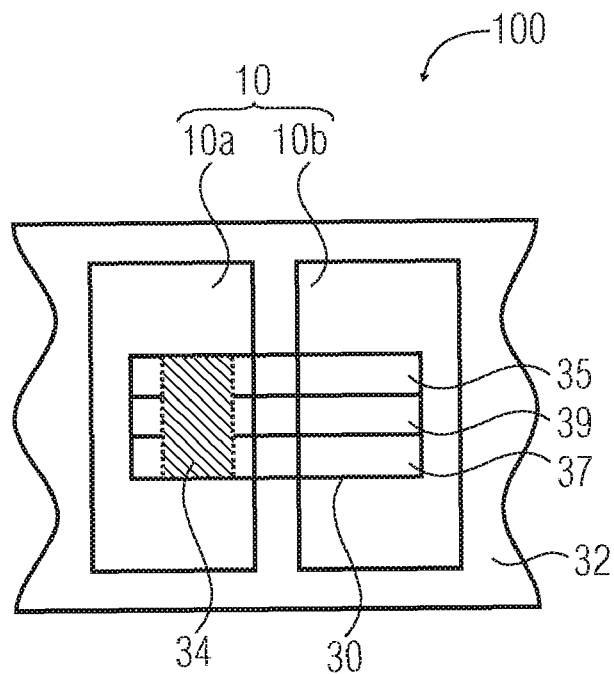
FIG. 3b illustrates a schematic top view drawing of power semiconductor device according to another embodiment.

In FIG. 3b, another embodiment is illustrated. The reference numerals of the different parts, illustrated in FIG. 3b correspond to the reference numerals described in context with FIG. 3a.

In this embodiment, the inactive region 34 and the gap 9 of the metallization layer 10 are mutually arranged, so that the gap does not overlap with the inactive region 34. Nevertheless an electrical power dissipation below the gap 9 is reduced compared to an electrical power dissipation below the first part 10 and the second part 10b of the metallization layer 10. This means that, the inactive region in which the electrical power dissipation is zero or smaller than an electrical power dissipation in the active region may be capable to reduce a heating caused by an electrical power dissipation below the gap, even if there is no direct overlap between the inactive region and the gap of the metallization layer.

Figure 4A:
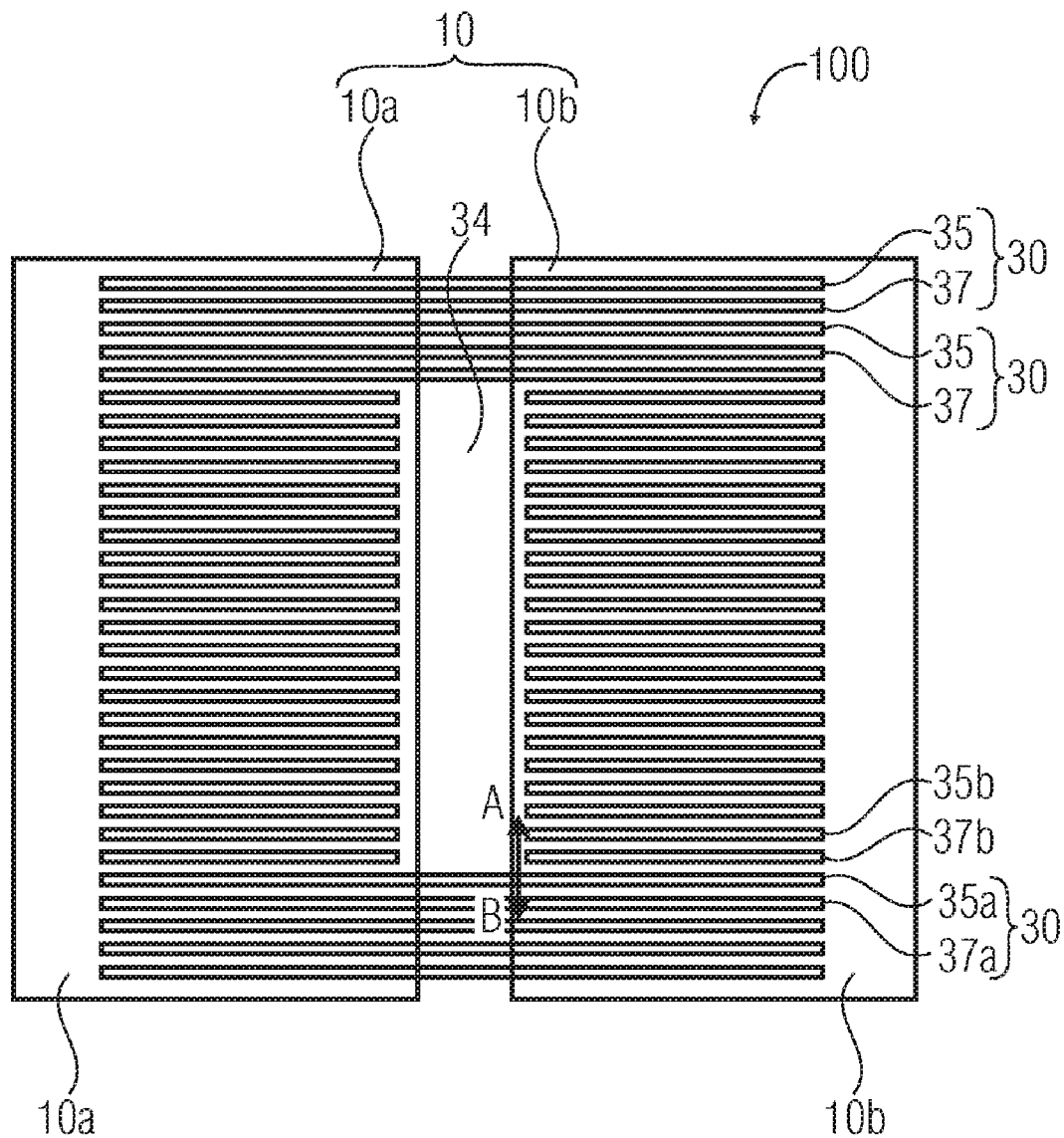
FIG. 4a illustrates the schematic top view of a lateral DMOS transistor with a power copper metallization layer and inactive regions according to one embodiment.

FIG. 4a illustrates another embodiment. In this figure, the schematic top view of a lateral DMOS transistor is illustrated. The lateral DMOS transistor 100 has a plurality of first 35 and second 37 terminal regions, which are formed in this embodiment as source terminal regions 35 and drain terminal regions 37. For clarity the controllable region is not illustrated in FIG. 4a. The lateral DMOS transistor 100 has in this embodiment a plurality of active regions arranged in parallel, which are represented in FIG. 4a by a pair of source terminal region 35 and the respective drain terminal region 37. In this embodiment, a couple of active regions 30 arranged in parallel have inactive regions 34 in the center part of the lateral DMOS transistor 100. This means that in this embodiment the parallel arranged active regions close to the edge of the power semiconductor device 100 do not have an inactive region, while others in the center part have inactive regions 34. This design layout may be chosen since the maximum temperature swing during operation of the power semiconductor device is observed in the center part of the power semiconductor device.

The first part 10a and the second part 10b of the metallization layer 10 are arranged, on the upper surface of the lateral DMOS transistor 100. In this embodiment, the first part 10a may be in electrical contact to the source terminal regions, wherein all source terminal regions of the lateral DMOS transistor 100 may be connected to each other, and the second part 10b of the metallization layer 10 may be connected to the drain terminal regions 37, wherein also all drain terminal regions 37 are connected to each other. The metallization layer 10 may be a power copper layer, with a thickness larger than 2 µm, for example, 10 µm.

In on or more embodiments, a DMOS transistor may have a plurality of DMOS transistor cells. The individual DMOS transistor cell may share a common drain contact and also the source regions of the DMOS transistor cells may be connected to each other. The same is true for the gate terminal regions, which are not illustrated in FIG. 4a in order to control the channel region between the source and the drain terminal regions. The gate terminal region of the different active areas may be also shorted together and may be, for example, formed by polysilicon. Therefore the plurality of DMOS transistor cells may be treated as a single DMOS transistor. DMOS transistors according to one or more embodiments may be fabricated, for example, in a vertical DMOS technology or in the BCD technology (bipolar-CMOS-DMOS) technology.

Figure 4B:
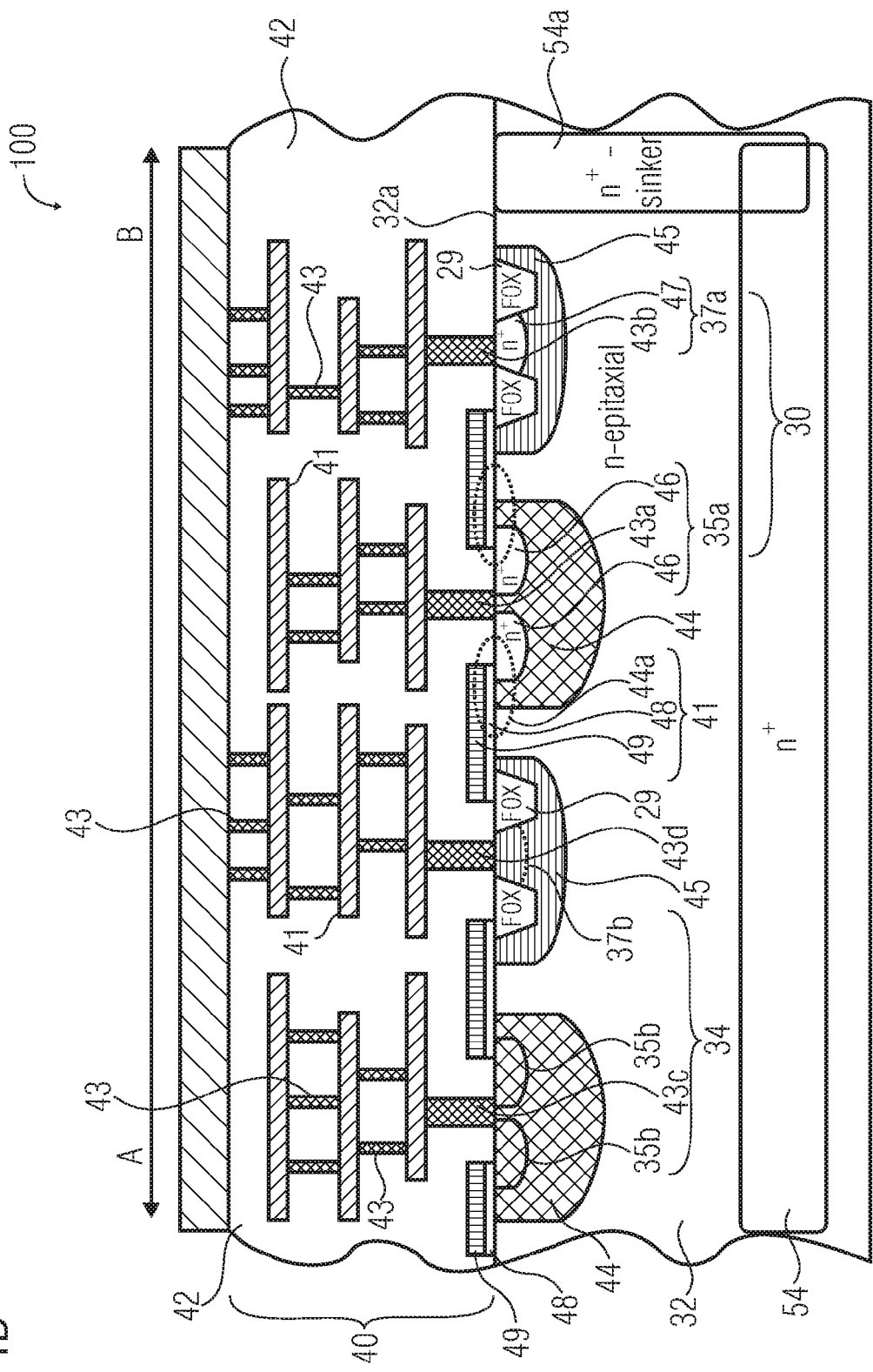
FIG. 4b illustrates the cross-section (A-B) of the lateral DMOS transistor illustrated in FIG. 4a, wherein the cross-section illustrates active and inactive regions of the power semiconductor device.

FIG. 4b illustrates the cross-sectional view at the intersection line A-B (FIG. 4a) of the lateral DMOS transistor from FIG. 4a. In this cross-sectional drawing, an active area 30 represented by a source terminal region 35a and a drain terminal region 37a and an inactive region 34 represented by a missing source terminal region 35b and a missing drain terminal region 37b in the semiconductor substrate 32 are illustrated. The source and drain terminal regions may also include contact plugs 43a-43d. The lateral DMOS transistor 100 may have on the upper surface of the power semiconductor device the drain part 10b of the power copper metallization layer 10. A conductive path between the second part of the power copper metallization layer may be formed in this embodiment to the drain terminal region 37a and 37b. The power semiconductor device 100 may exhibit a contact layer 40 between the metallization layer 10 above the active region on the upper surface of the power semiconductor device and a main semiconductor substrate surface 32a, wherein the contact layer 40 includes further metallization layers 41. The contact layer region 40 may have insulating layers or an insulating material 42, which is insulating the different further metallization layers 41, the semiconductor substrate 32 and the second part 10b of power copper metallization layer 10 against each other. Depending on the functionality of the metallization layer, the metallization layers may be electrically connected to each other by means 43 for forming a conductive path between the metallization layers. Such means can be, for example, VIAs (Vertical Interconnect Access) or plugs filled with electrical conductive material. The drain metallization layer 10b is in this embodiment via several metallization layers 41 and with VIAs, which connect the several metallization layers with the drain terminal regions 37a and 37b electrically connected. The source terminal regions 35a and 35b can be connected in a similar way with the source metallization layer 10a (not illustrated in FIG. 4b) of the power metallization layer 10.

The lateral DMOS transistor in this embodiment may be formed as a double diffused n-channel MOSFET. It is also possible to form a respective p-channel MOSFET. The semiconductor substrate, which includes the active region and the inactive region, may be therefore a n-type doped epitaxial silicon substrate. The silicon substrate has in this embodiment p-doped body zones 44 and n-well zone 45 separated from each other and arranged adjacent to the main silicon substrate surface 32a. The n-well structures 45 have in this embodiment a field oxide structure (FOX) 29. In the active region 30, the p-body zones 44 and the n-well zones 45 may have heavily $n^+$-doped source 46 and drain 47 contact zones. These source contact zones 46 and drain contact zones 47 are configured to provide a good electrical and thermal contact to conductive plugs configured to connect these contact zones with the respective metallization layers for the power supply. The heavily $n^+$-doped contact regions 46 and 47 may have a dopant concentration $n \geq 10^{18}$ $cm^{-3}$, for example, $n=10^{19}$ $cm^{-3}$. The contact zones 46 and 47 may have a n-type dopant, for example, phosphor, antimony or arsenic atoms. The p-body zone 44 may further include a controllable channel region 44a, which can be controlled by a gate electrode 49 arranged above the channel region 44a and separated from the channel region by an insulating layer 40a, the gate oxide respectively. The gate electrode or the gate terminal region 49 may be formed by a polysilicon or by a metallic material. That means a MOSFET is formed by the source contact zone 46, the channel region 44a with the gate oxide 48 and the gate electrode 49 and the drain electrode 47 arranged in the n-well structure 45. In this embodiment, the source terminal region 35 may be formed by the $n^+$-doped source contact zone 46a, and the contact plug 43a, which is configured to connect the source contact zone 46 with a metallization layer or conductive layer in the contact layer region 40. The controllable region 41 may have in this embodiment the channel region 44a of the MOSFET, the gate oxide 48 and the gate terminal region, the gate electrode 49 respectively. The drain terminal region 37a has a n+-doped drain contact zone 47 and a respective contact plug 43b.

During the operation of the lateral DMOS transistor 100 an electrical power dissipation may occur in the active region 30 caused by a current flux from the source terminal region 35a through the controllable region 41 to the drain terminal region 37a. This current flux may be the cause of the temperature swing as described above. Thereby the current may pass parts of the n-epitaxial substrate and the n-well structure 45 as well.

In conventional DMOS structures the edges of the power copper layer at the gap between the two metal parts may apply mechanical stress to underlying dielectric intermediate or metal layers during heating or temperature cycling of the DMOS. This may lead to cracks in the respective intermediate or metal layers and finally to a malfunction of the DMOS transistor. By forming inactive regions as described in one or more embodiments and as schematically illustrated, for example, in FIG. 3a, the mechanical stress at the edges of the gap can be reduced or minimized.

The silicon substrate 32 may further exhibit beneath the p-body zones and the n-well zones 45 a heavily n+-doped buried layer 54 with a n+-sinker 54a, which is connected to the main silicon substrate surface 32a. The n+-doped buried layer may be configured to suppress an undesirable current flux in the silicon substrate 32.

In the inactive region 34, the MOSFET structure is not formed fully functional. For example, in the embodiment illustrated in FIG. 4b the highly n+-doped contact zones 46, 47 for the drain 37b and the source 35b are missing. In other words, the inactive region is configured so that a transistor structure of the lateral DMOS transistor is not working. That means an inactive area can be formed in different ways. As it is illustrated in FIG. 4b, the n+-doped contact zones 35b and 37b for the contact plugs 43c and 43d are missing (illustrated by dotted lines). It is also possible in a further embodiment that the contact plugs 43c or 43d to the n+-doped contact zones would be missing and would therewith form an inactive region. In another embodiment, the gate electrode 49, that means a part of the controllable region, may be missing. It is also possible that only the source terminal region or the drain terminal region is not formed functional. In another embodiment, the controllable region, the source terminal region and the drain terminal region may be missing in the inactive area. As a consequence of the not-functioning MOSFET structure in the inactive region of the power semiconductor device, only a reduced or a zero current flow and therefore only a reduced or zero electrical power dissipation may occur in the inactive region.

According to another embodiment certain VIAs 43 may be left out so that at least one of the source-, drain- or controllable region is not electrically connected to the respective power supply metallization layer. This means that again an inactive region is formed, which is constructed like an active region, but not electrically connected and hence not functioning correctly. This means that such an inactive region does not contribute to a power dissipation of the semiconductor device.

In embodiments an inactive region of the semiconductor device can be formed identical to an active region. This means, for example, the active and the inactive region may be doped and arranged identical in the semiconductor substrate. The inactive region, however, may include for example, a left out contact plug, a left out VIA (Vertical Interconnect Access) connection or missing other means for forming a conductive path between the first, the second or the controllable region of the inactive region and the respective power supply layers.

The inactive region may be distinguished from an active region of the semiconductor device by a reduced or zero current flow during operation or a switching-on or -off phase of the semiconductor device.

According to another embodiment the metallization layer 10 may be arranged at the opposite side of the main semiconductor substrate surface 32a, where the contact layer region 40 is arranged.

The remaining part of the power semiconductor device 100, for example, the contact layer 40, and the structures therein may be identical in the active area 30 and in the inactive area 34. This means that such a power semiconductor device may be manufactured without adding new structures or performing additional mask processes.

In one or more embodiments for the power semiconductor device, the inactive region 34 may have only one, only two or none of the first 35 and the second 37 terminal region and the controllable region 41.

Figure 5:
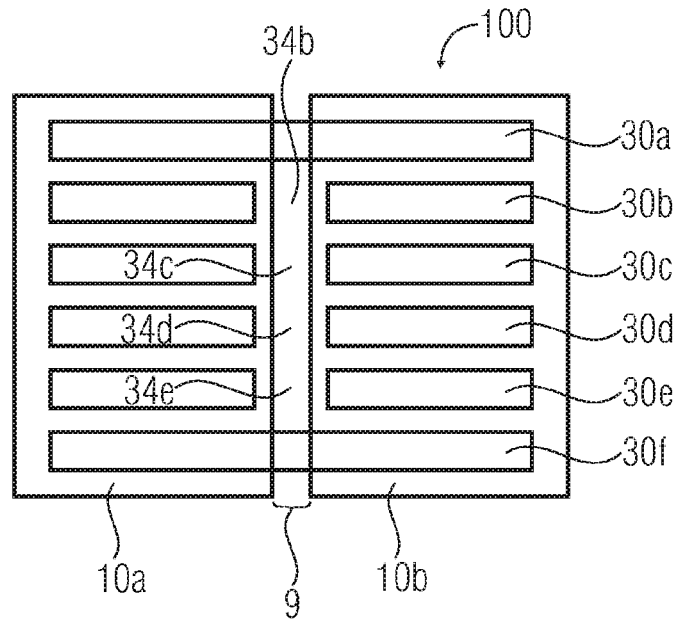
FIG. 5 illustrates a schematic top view of a vertical DMOS transistor with a power copper metallization layer on top of source and drain regions, wherein the active region includes inactive regions beneath the gap of the power metallization layer.

FIG. 5 illustrates in another embodiment the top view of a vertical DMOS transistor. The vertical DMOS transistor 100 has a plurality of active regions 30a to 30f parallel arranged as stripes in an array. The array has outer strips 30a and 30f and inner strips 30b to 30e. In this embodiment, the outer strips 30a and 30f do not have inactive regions 34a,e as the inner strips 30b to 30e.

In this embodiment, active regions, which are arranged close to the edge of the power semiconductor device, do not have an inactive region. As it is illustrated in FIG. 2a, the edge regions of a power semiconductor device have typically a lower temperature or a lower temperature swing compared to an inner part of the power semiconductor device. In one or more embodiments, power semiconductor devices may therefore have active regions without inactive regions at the edge or boundary of the power semiconductor device. The gap 9 between the source metallization layer part 10a and the drain metallization layer part 10b is in this embodiment with respect to the inactive region arranged so that the gap and the inactive regions 34b-e partly overlap. In this embodiment, some of the active regions 30b to 30e include an inactive region 34b to 34e and other active regions 30a and 30f do not include an inactive region.

From the illustrated top view of the vertical DMOS transistor in FIG. 5 it is evident that in the area, which includes the gap 9 no power loss or only a reduced power loss is produced during the operation of the device because of the inactive region 34b to 34e. Therefore the maximum temperature of the power semiconductor device in the center part of the DMOS 100 can be reduced. In other words, the temperature swing is reduced compared to a power semiconductor device which has even below the gap of the metallization layers 10a, 10b active areas which contribute to the heating of the device.

Figure 6A:
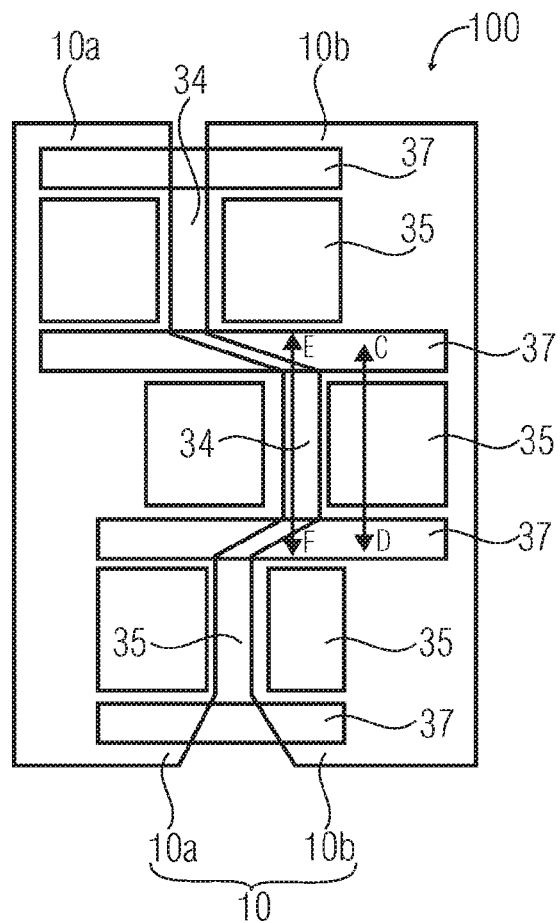
FIG. 6a illustrates a top view drawing of a vertical DMOS transistor according to one embodiment.

The embodiment in FIG. 6a illustrates a vertical DMOS transistor 100, wherein in this embodiment the layout of the metallization parts 10a, 10b and the active region 30 is different to those described above. That means the layout for the semiconductor device according to the invention may have different layout structures, which may be configured to a specific application. In FIG. 6a, drain terminal regions 37 are parallel and alternating arranged with source terminal regions 35. In this embodiment, only the missing source terminal regions form the inactive regions 34. An active region 30 is formed by a drain terminal region 37, a source terminal region 35 and a controllable region that is not illustrated in FIG. 6a. The metallization layer 10 exhibits again two parts 10a and 10b, which are connected electrically to the respective source and drain terminal regions. The first and the second part of the metallization layer can be formed differently and can include different metals. The metallization layer 10 may include copper, aluminum or any other metal or alloy. The drain terminal regions 37 may have a width of 30 μm and the source terminal regions may have a width of 120 to 130 μm. The distance between two source body regions may be between 5 to 10 μm.

Figure 6B:
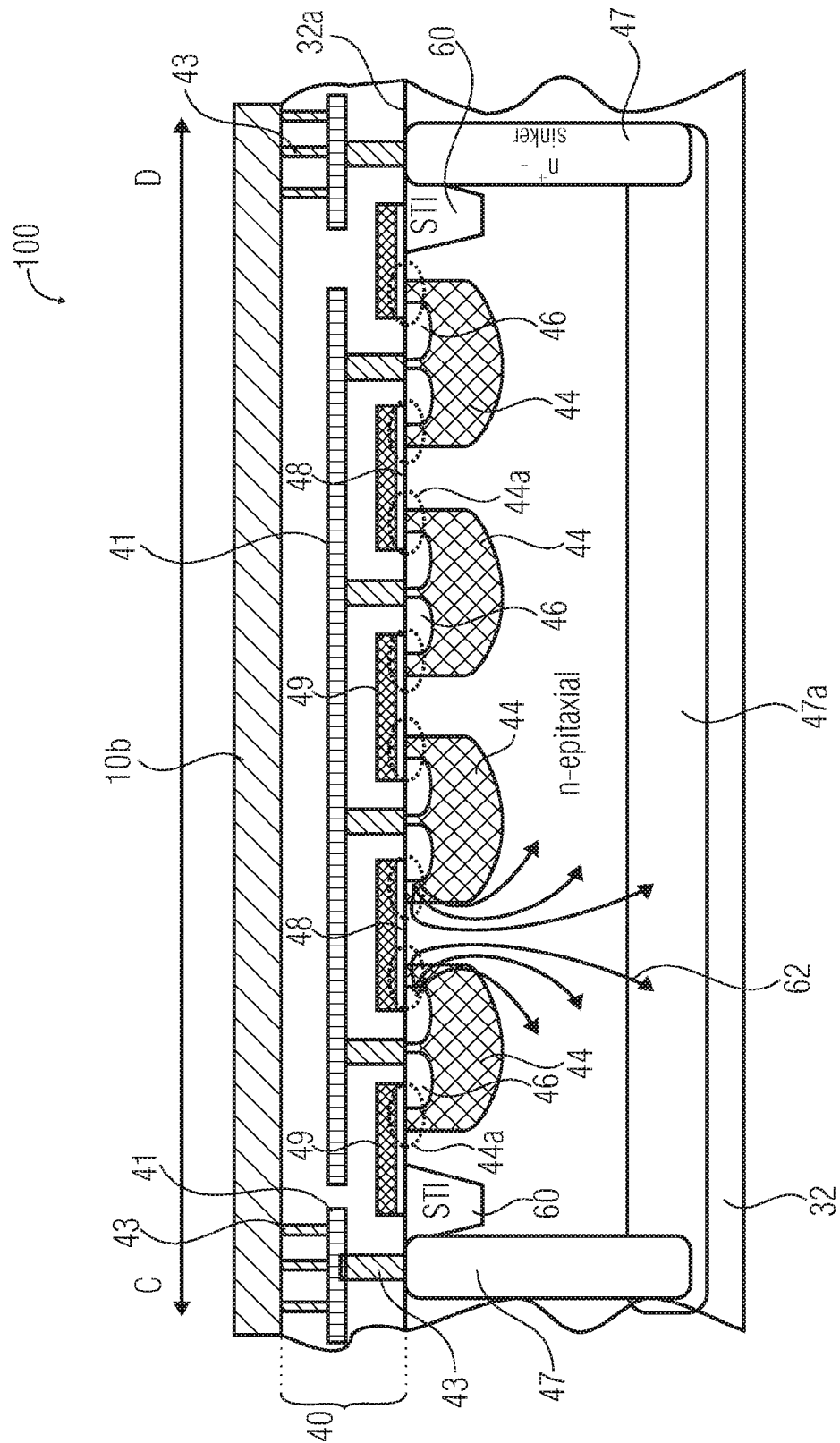
FIG. 6b illustrates the cross-section (C-D) of the vertical DMOS transistor illustrated in FIG. 6a, wherein the active region is not interrupted by an inactive region.

FIG. 6b illustrates a schematic cross-sectional view of the vertical DMOS transistor 100 from FIG. 6a at the intersection line C-D. The intersection line C-D runs through an active region 30 of the vertical DMOS transistor. The vertical DMOS transistor may be formed as an n-channel DMOS-FET. The semiconductor substrate may be in this embodiment again an n-epitaxial silicon substrate 32 with p-doped body zones 44, formed in the silicon substrate adjacent to the silicon substrate surface 32a. The p-body regions 44 may exhibit a p-conductivity type dopant, i.e. boron, aluminum or indium. The p-body zone 44 may again have source contact zone 46 which are heavily doped with a n-conductivity type dopant. The p-doped body zone 44 may have a dopant concentration of $7 \times 10^{-15}$ cm$^{-3}$. The n$^+$-doped source contact zones 46 may have a n-type dopant concentration of $10^{-19}$ cm$^{-3}$. The distance between two source body regions may be between 5 to 10 μm. The drain terminal region may be formed in this embodiment by a n$^+$-doped buried layer 47a, which is arranged in the silicon substrate below the p-doped body regions 44 and which is via the n$^+$-doped sinker 47 to the main surface 32a of the silicon substrate connected. The vertical DMOS structure 100 includes again a channel region 44a formed in the p-doped body regions between the n$^+$-doped source contact zones 46 and the n-epitaxial silicon substrate 32 and the drain contact zone 47 and 47a. Above the channel region 44a an insulating layer or a gate oxide 48, arranged, which separates the channel region 44a from a gate electrode 49. The field-effect transistor (FET) structure is in this embodiment formed by the source contact zone 46, the channel region 44a, the gate electrode 49, with the gate oxide 48 between the channel region and the gate electrode 49 and the drain region, formed by the n$^+$-doped buried layer 47a and the n$^+$-sinker 47. During operation, the current may flow from the n$^+$-doped source contact zone 46 through the channel region 44a and the n-epitaxial silicon substrate 32 to the n$^+$-doped buried layer 47a or the n$^+$-doped sinker 47. The vertical DMOS-FET 100 may again exhibit a contact layer 40 with several metallization layers 41 and vias or contacts 43, which may electrical connect different metallization layers, and wherein in this embodiment the topmost power copper metallization layer 10b is again in electrical contact to the drain terminal region 47, the n$^+$-sinker. The drain terminal regions may again have contact plugs 43a, which may form a contact to the respective drain metallization layer 10b. The drain terminal regions and the source terminal regions may be separated at a surface region of the semiconductor substrate of the vertical DMOS transistor by a shallow trench isolation 60 STI. The gate terminal region 49 may be again formed by polysilicon. But it is also possible that the gate electrode is formed by a metal. A current flux during operation of the DMOS is in FIG. 6b indicated by the arrows 62.

Figure 6C:
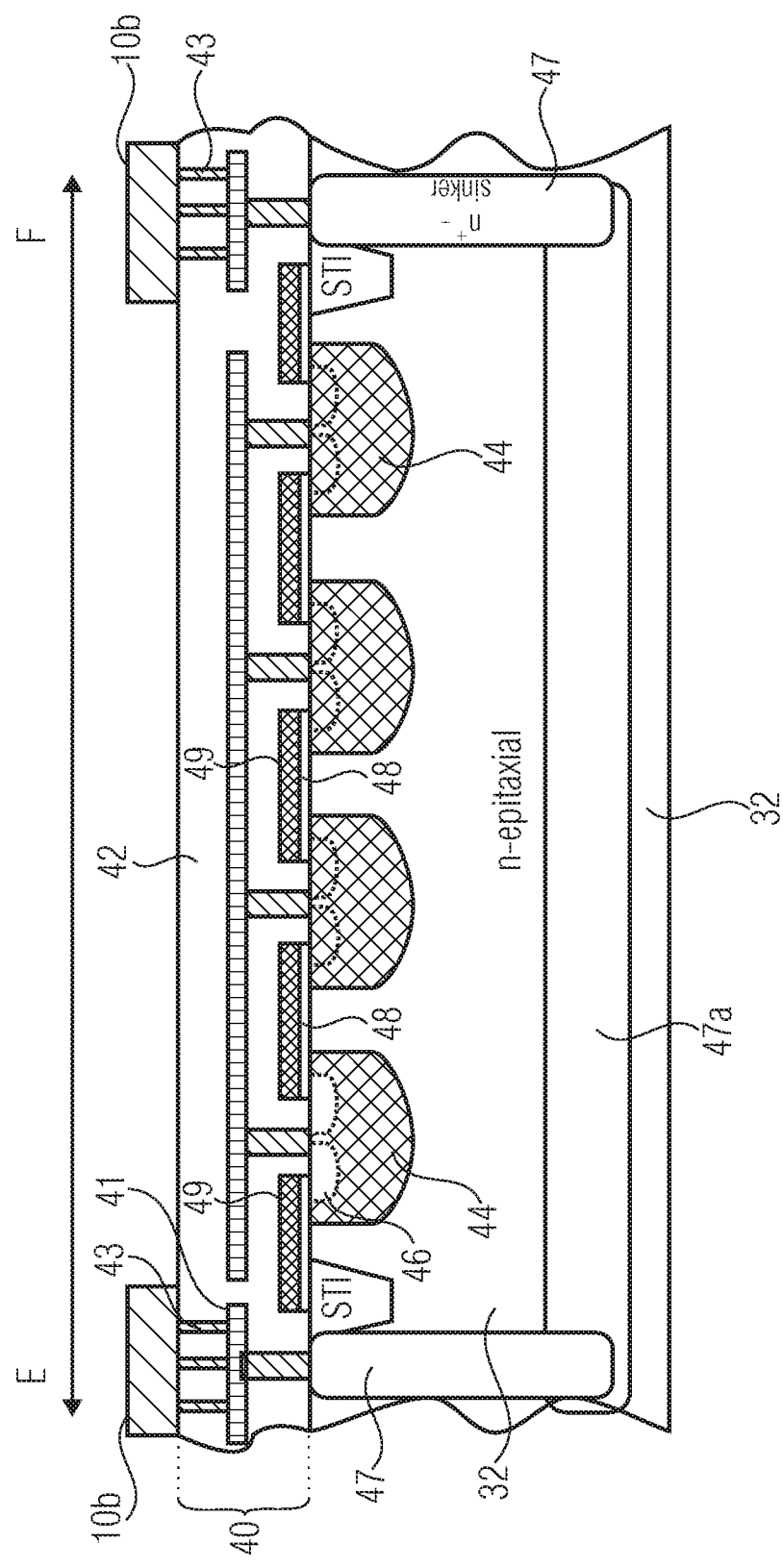
FIG. 6c illustrates the cross-section (E-F) of the vertical DMOS transistor illustrated in FIG. 6a, wherein the cross-section illustrates an inactive region of the power semiconductor device.

FIG. 6c illustrates another cross-sectional view of the vertical DMOS transistor at an intersection line E-F (see FIG. 6a). In this cross-section, an inactive region is marked by a missing full-functional source terminal region is illustrated. The reference numerals in FIG. 6c are explained in context with the description of FIG. 6b. The difference between the FIGS. 6c and 6b is the missing heavily n$^+$-doped source contact zones 46. This means that the inactive region is in this embodiment formed by a source terminal region, which is not functional. Therefore, no current or only a reduced amount of current flows during the operation of the power semiconductor device through this inactive region to the drain terminal region 47a and 47. This means that the inactive region does not have a working MOSFET structure. In other words, in this embodiment the inactive region is not formed as a functional MOSFET structure.

It is possible that an inactive region includes only one, only two or none of the first and the second terminal region and the controllable region. In a further embodiment, for example, the channel region of the controllable region may be missing in the inactive region of the power semiconductor device. That means, for example, the p-body zones may be partially absent or interrupted so that no channel region in inactive region is formed.

It should be noted that except of the missing n$^+$-doped source contact zones 46 the structures in the FIG. 6b with the active region and in FIG. 6c with the inactive region may be identical. Therefore an inactive region in the vertical DMOS transistor may be manufactured without additional mask processes or without forming additional semiconductor or contact structures.

The FIGS. 7a to 7f illustrate schematically further embodiments of inactive regions formed in a power semiconductor device according to the invention. In the FIGS. 7a to 7f, the top view structure of the drain contact zone 47, the source contact zone 46 and the p-body zone 44 are illustrated schematically. The drain and the source terminal regions may include the n$^+$-doped contact zones 46 and 47 and contact plugs (not illustrated in FIG. 7a-f) as described above.

Figure 7A:
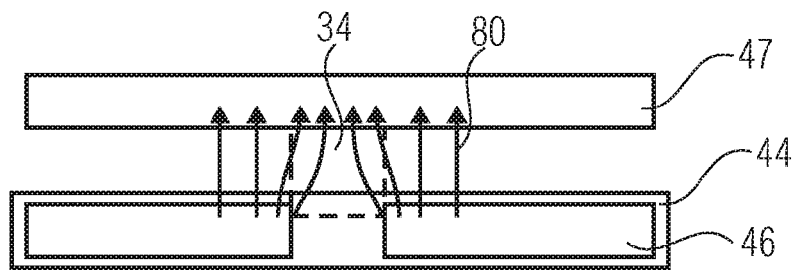
FIG. 7a illustrates a schematic top view of an active region of a power semiconductor device interrupted by an inactive region, wherein the inactive region is formed by an interrupted source terminal region according to one embodiment.

In the embodiment illustrated in FIG. 7a, only the n$^+$-doped source contact zone 46 is missing in the inactive area 34. That means the p-body zone 44 does not have a n$^+$-doped source contact zone for the source contact to the metallization layers. In the inactive region 34 will be a reduced current flux during operation of the power semiconductor device as indicated by the current flux arrows 80.

Figure 7B:
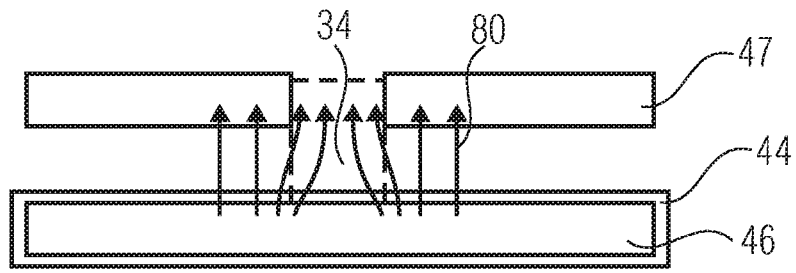
FIG. 7b illustrates a schematic top view of an active area interrupted by an inactive area, wherein the inactive area is formed by an interrupted drain terminal region according to a further embodiment.

In the embodiment illustrated in FIG. 7b, the n$^+$-doped drain terminal region is in the inactive region interrupted. In this embodiment, the source contact zone 44 is fully developed in the p-body region 44. The arrows 80 indicate again the current flux from the source terminal region to the left drain terminal region.

Figure 7C:
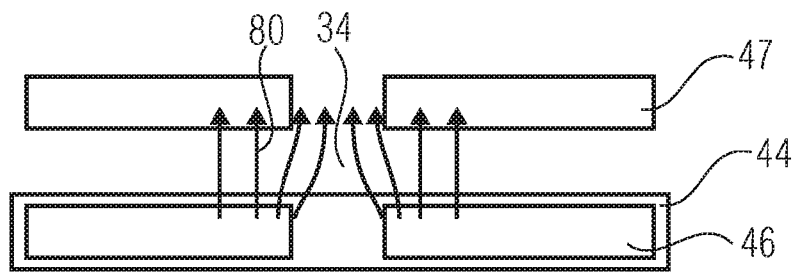
FIG. 7c illustrates a schematic top view of an active area interrupted by an inactive area, wherein the inactive area is formed by a discontinuity of the source and the drain terminal region.

In the embodiment illustrated in FIG. 7c, the n$^+$-doped drain contact zone 47 and the source contact zone 46 in the p-body zone 44 are missing. In the inactive area 34, the electrical power dissipation is again decreased compared to the fully developed transistor zones.

Figure 7D:
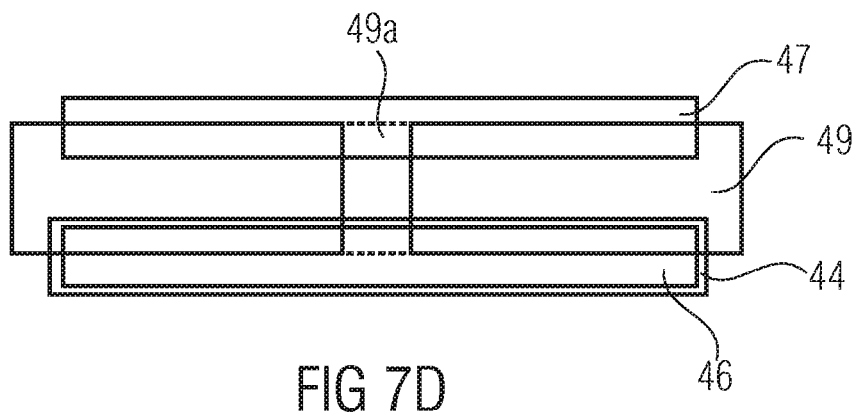
FIG. 7d illustrates another top view of an active area interrupted by an inactive area, wherein in this embodiment the controllable region is interrupted according to a further embodiment.

FIG. 7d illustrates a further embodiment. The inactive zone 34 is in this embodiment formed by a partly missing gate electrode 49. The source 46 and the drain 47 contact zones are fully developed in this embodiment. During operation, a channel region below the missing gate electrode part 49a does not or only less current conduct contact, since the control gate to open the conductive channel is missing.

Figure 7E:
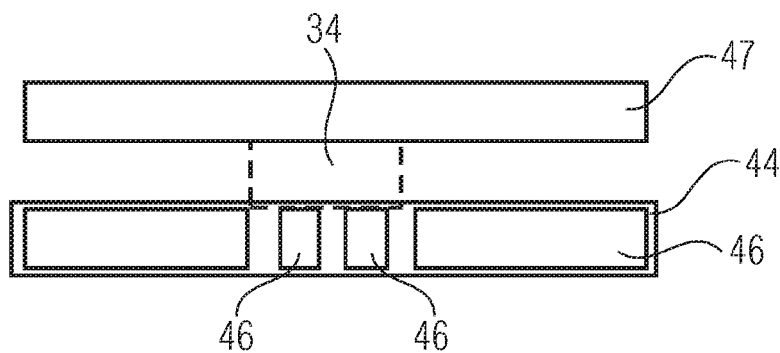
FIG. 7e illustrates the top view of an active area interrupted by an inactive area, wherein in this embodiment the inactive area is formed by an interrupted source terminal region, wherein the interrupted source terminal parts have several functional $n^+$-doped regions.
Figure 7F:
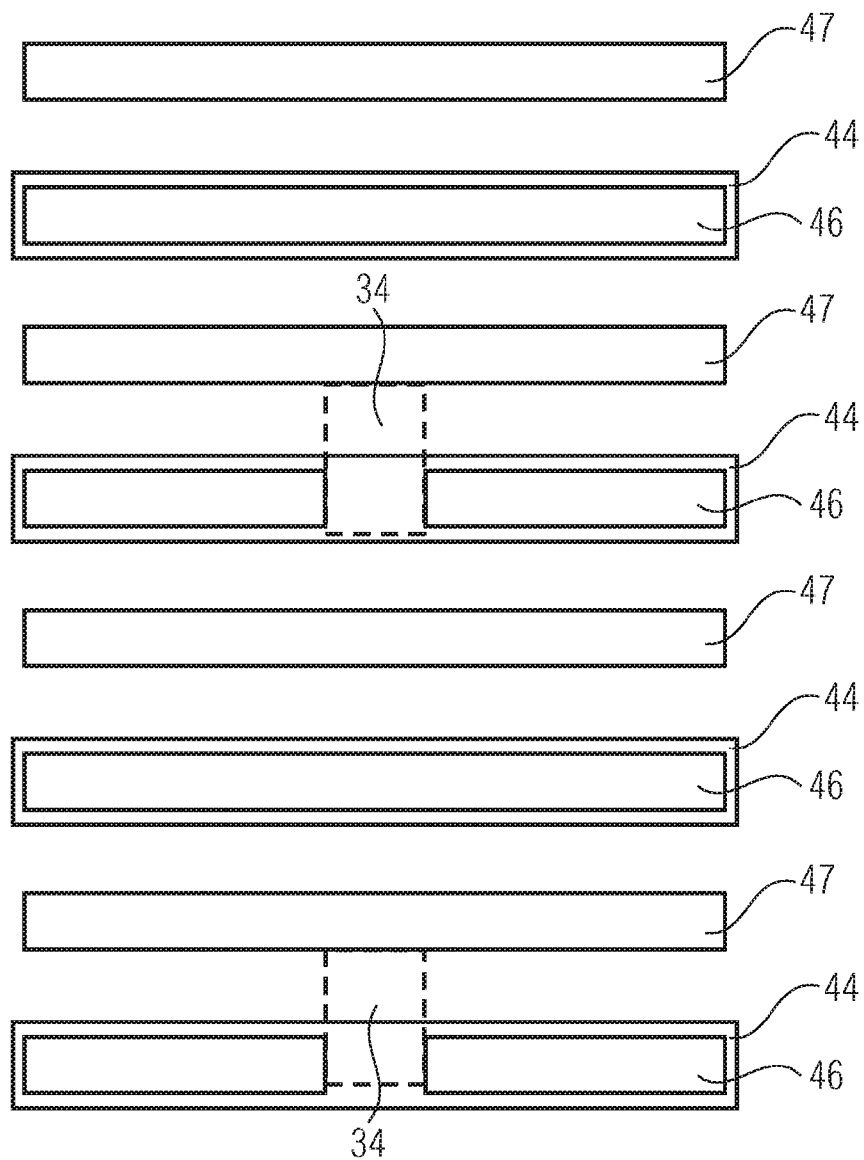
FIG. 7f illustrates schematically in another top view a plurality of active areas arranged in parallel, wherein in this embodiment alternating one active area is interrupted by an inactive area and a following does not exhibit an active area.

It is evident from the embodiments described so far that as it is illustrated in FIG. 7e, the respective source and drain contact zone may have a plurality of discontinuities in order to form an inactive region 34. In this context, for example, the source contact zone 46 in the p-body region 44 may include several highly n$^+$-doped regions.

A semiconductor device may have a plurality of active regions formed by a first terminal region, a second terminal region and a controllable region. It is clear that, for example, as it is illustrated schematically in FIG. 7f only every second active region may be interrupted by an inactive region, or any other combination of active regions 30 without inactive regions 34 and active regions with inactive regions may be manufactured in order to achieve a reduction of the temperature swing of the power semiconductor device, as described above.

Figure 8A:
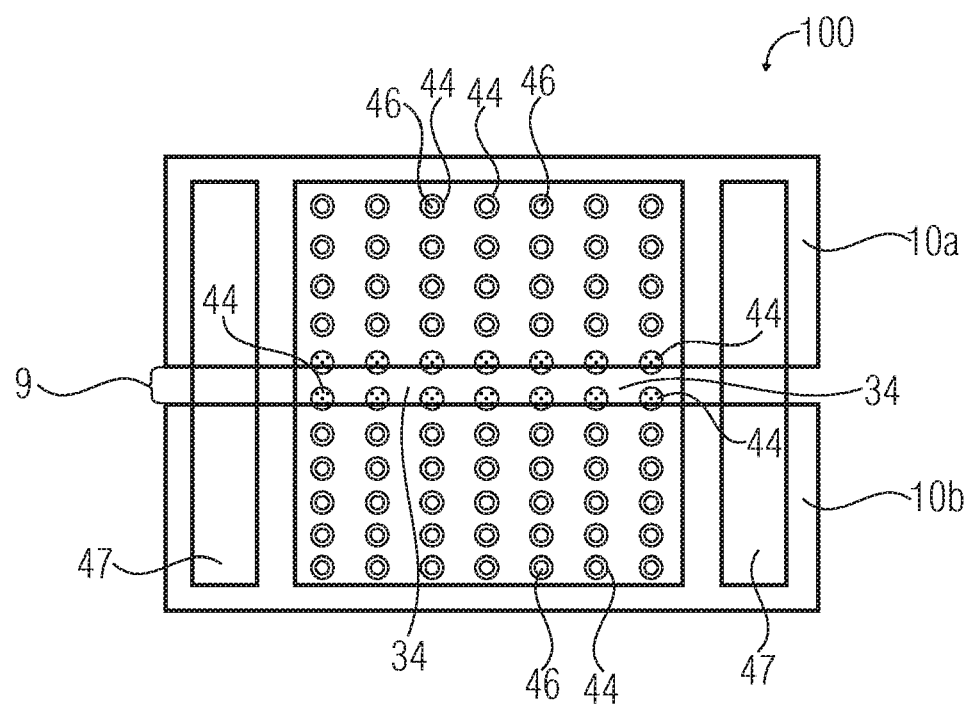
FIG. 8a illustrates the top view of a DMOS transistor having point-shaped source terminal regions according to another embodiment.

One or more embodiments, which are described so far have often parallel arranged active regions. It should be noted that the shape of the active regions and the inactive regions may be formed differently. FIG. 8a illustrates the top view of a DMOS transistor 100 having point-shaped n⁺-doped source contact zones 46 with a p-body zones 44. At the topmost of the power semiconductor device the first 10a and the second 10b metallization layer part is arranged. The point-shaped source terminal regions are formed in point-shaped p-body regions 44 in a semiconductor substrate. The drain terminal regions may be formed as n⁺-doped sinkers 47 and may be arranged in stripes adjacent to the area of the point-shaped source terminal regions. In embodiments an inactive region can have only one, only two or none of the first and the second terminal region and the controllable region. In the embodiment illustrated in FIG. 8a, for example, the n⁺-doped source contact zone 46 is missing in the inactive region 34 below the gap of the metallization layer 10. On top of the power semiconductor device 100 is again a metallization layer 10 arranged, wherein the source and drain parts 10a and 10b are connected electrically to the respective terminal regions of the DMOS transistor.

Figure 8B:
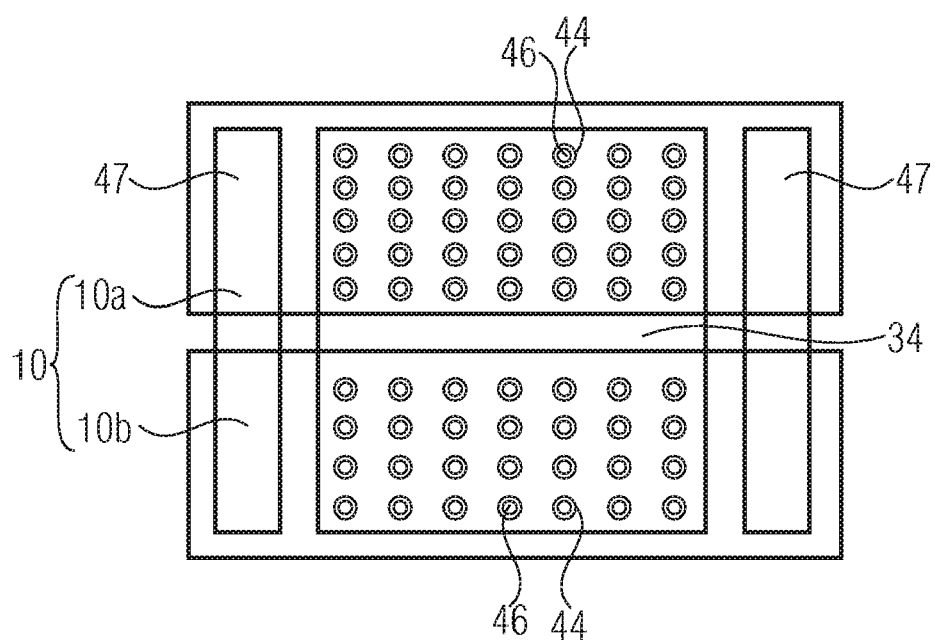
Figure 8C:
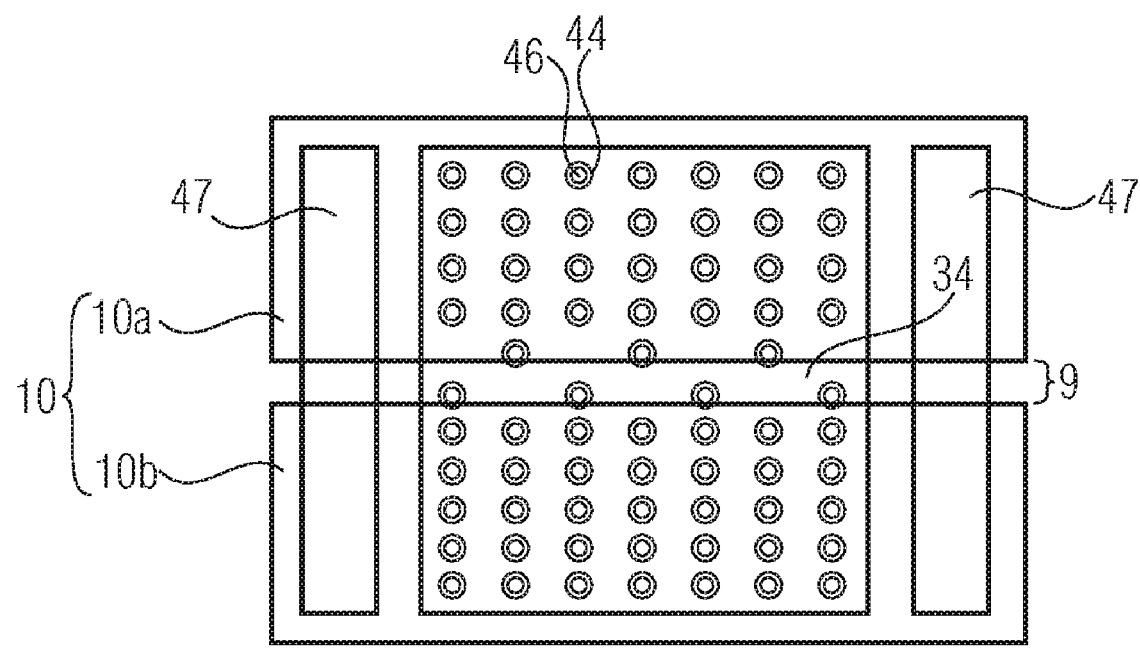

In another embodiment illustrated in FIG. 8b, the inactive region 34 has no source contact zones 46 and p-body zones 44 below the gap 9 of the metallization layer 10. In a further embodiment illustrated in FIG. 8c, the inactive region 34 below the gap has a density of source contact zones 46, which is smaller than a density of source terminal regions beneath the power copper metals 10a and 10b.

In these embodiments the width of the drain terminal region 47 may be between 10 µm and 50 µm, and the length of the drain terminal region may be about 100 µm. The width of the area of the source terminal region may be between 100 µm to 150 µm.

Figure 9:
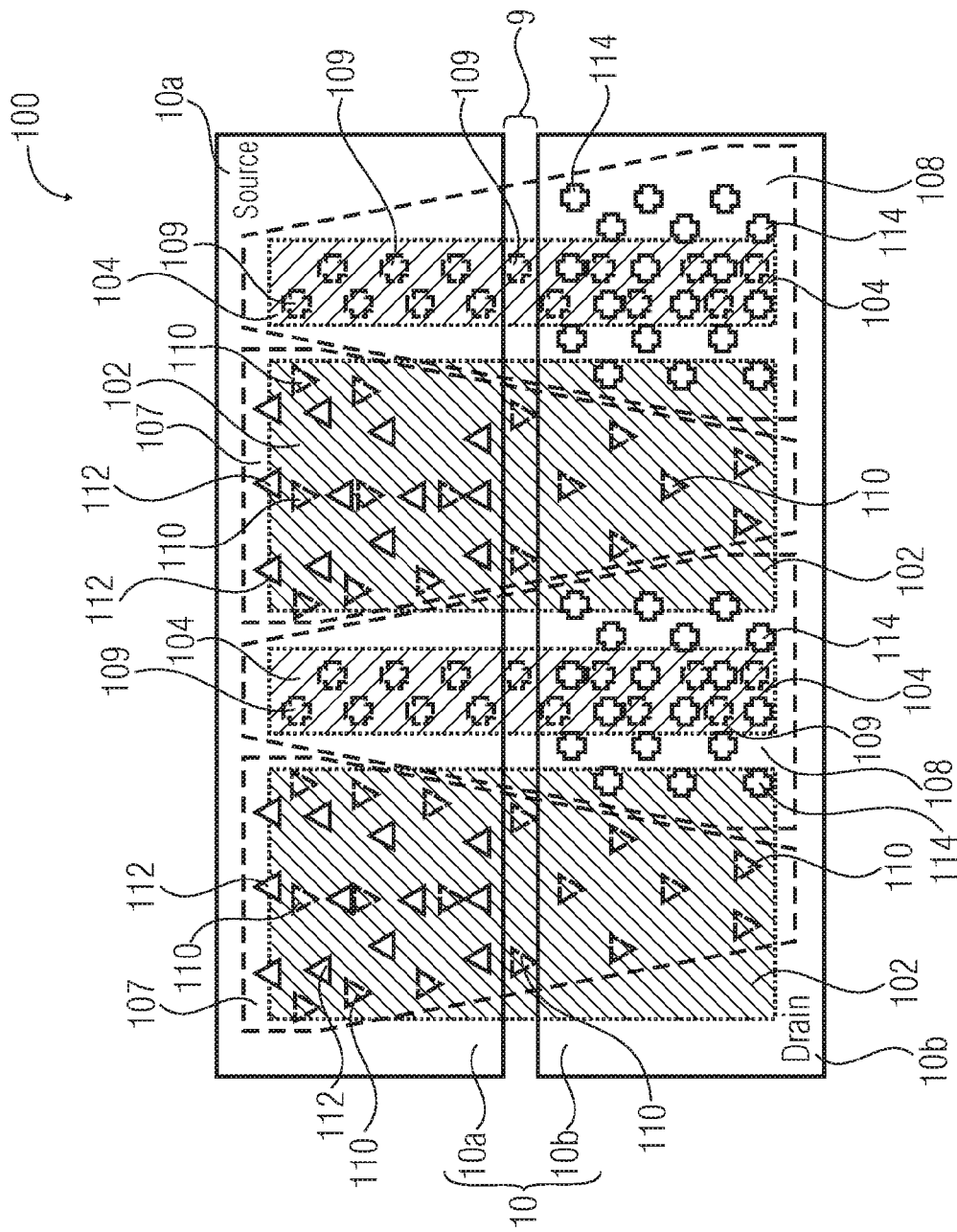
FIG. 9 illustrates the schematic top view of a power semiconductor layer having a power copper layer on top of a first and second copper metallization layer according to another embodiment.

In FIG. 9 two further copper metallization levels are illustrated, which may be arranged between the main surface of the semiconductor substrate (not illustrated in FIG. 10) and the power copper metallization layer 10, which is separated in a source metallization layer part 10a and a drain metallization layer part 10b. The first copper layer is also separated in two rectangular parallel arranged parts 102 and 104, which are in electrical contact to the respective subjacent source and drain terminal regions in the semiconductor substrate. Above this first copper layer, which is separated in a drain 104 and source 102 metallization layer part, a second copper metallization layer is arranged. The second copper layer may have, for example, as illustrated in FIG. 9, a "Christmas tree-like shape". The second copper layer may be again separated into a source part 107 and a drain part 108. The corresponding source and drain metallization parts of the first and the second copper layer are connected by using vias 110 (source) and 109 (drain). The "Christmas tree-like shape", respectively the trapezoid-like shape, may improve the ampacity of the power semiconductor device and may thus contribute to an improved electro-migration behavior. Above the first and second copper metallization level the power copper metallization layer 10 with his two parts 10a and 10b is arranged. The source metallization part 10a of the power copper layer 10 is connected to the subjacent source parts 107f the second copper metallization layer by vias 112. The drain metallization layer part 10b of the power copper metallization layer 10 is connected with the respective drain metallization layer part 108 of the second copper metallization layer by using vias 114. The power copper metallization parts 10a and 10b form the topmost metallization layer of the power semiconductor device 100. For clarity in FIG. 9 the active region and the inactive region are not illustrated. The first and the second metallization layer 10a and 10b of the power copper metallization layer are separated by the gap 9. The different metallization layers and the main surface of the semiconductor substrate may be separated by insulating layers which are not illustrated in FIG. 9. The electrical contact between the different metallization layers may be provided by vias or other means configured to form a conductive path between the individual metallization layers.

Figure 10:
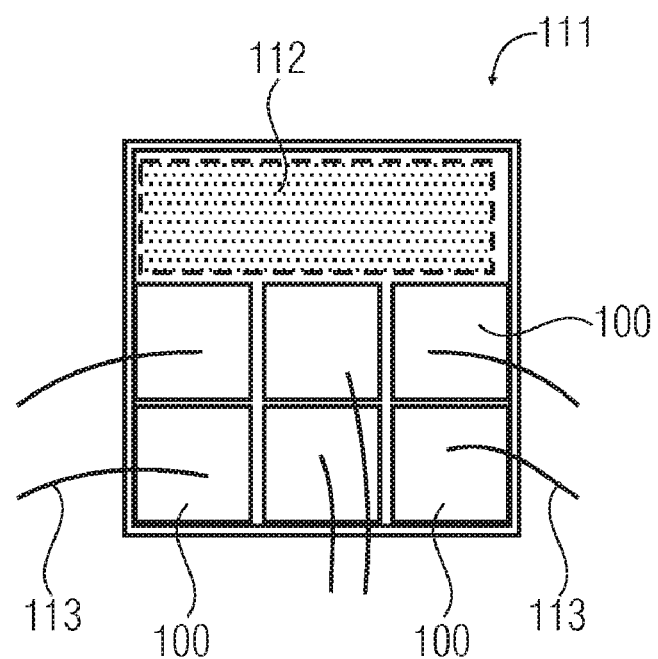
FIG. 10 illustrates the schematic top view of a switching unit having a plurality of power semiconductor devices according to another embodiment.
Figure 12:
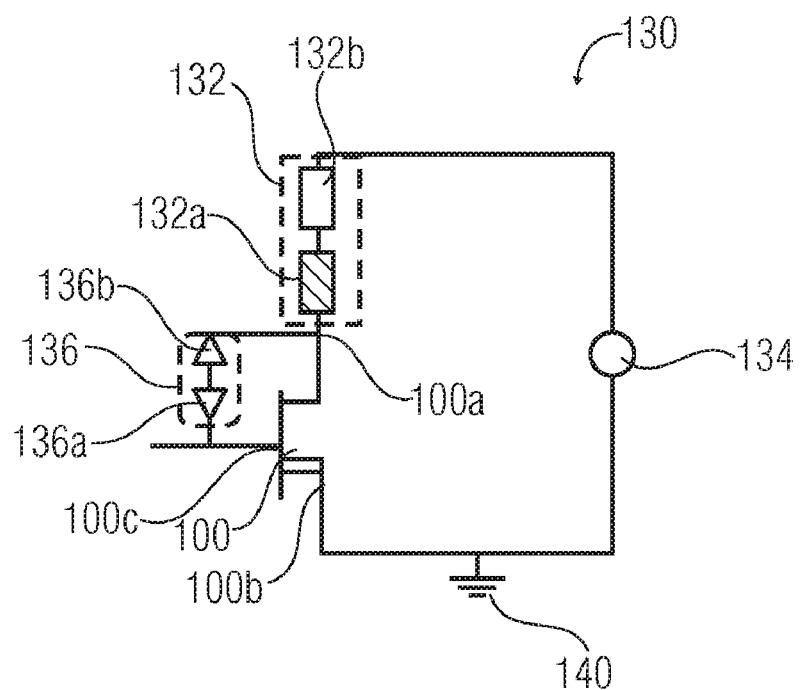
FIG. 12 illustrates an electrical circuit including a power semiconductor device protected by a zener diode according to one embodiment.

FIG. 10 illustrates another embodiment. A switching unit 111 includes a plurality of power semiconductor devices 100 and a logic part 112. The logic part 112 and the power semiconductor devices 100 may be monolithically integrated in one chip. The logic part 112 of the switching unit may have analog parts, control parts for the temperature and excess voltage control of the switching unit, as well as the control logic for the power semiconductor devices 100. The different components of the switching unit 111 may be processed in the same or in a different semiconductor manufacturing technology. For example, some parts may be processed in a bipolar technology others in a CMOS or in a DMOS process technology.

The switching unit 111 may have logic circuitry and a plurality of semiconductor devices 100, for example, power semiconductor devices, wherein each of the power semiconductor devices may have a power supply line 113, which is bonded to the topmost metallization layer, for example, the power copper metallization layer and wherein the switching unit 111 with the power semiconductor devices 100 is configured to switch an application coupled to the switching unit. Applications for such an switching unit 111 may be for example, magnetic valves, magnetically driven actuators, an electromotor, a transformer having a iron core, an electrogenerator, or a coil having an inductance larger than for example, 1 µH. The switching unit may be used for robotic control and as a switch for automotive and industrial systems. The switching unit 111 may be for example, able to switch 12 V, 24 V, 42 V or 48 V applications. A drain-source clamping voltage for the power semiconductor devices 100 may be for example, 55 V.

Figure 11:
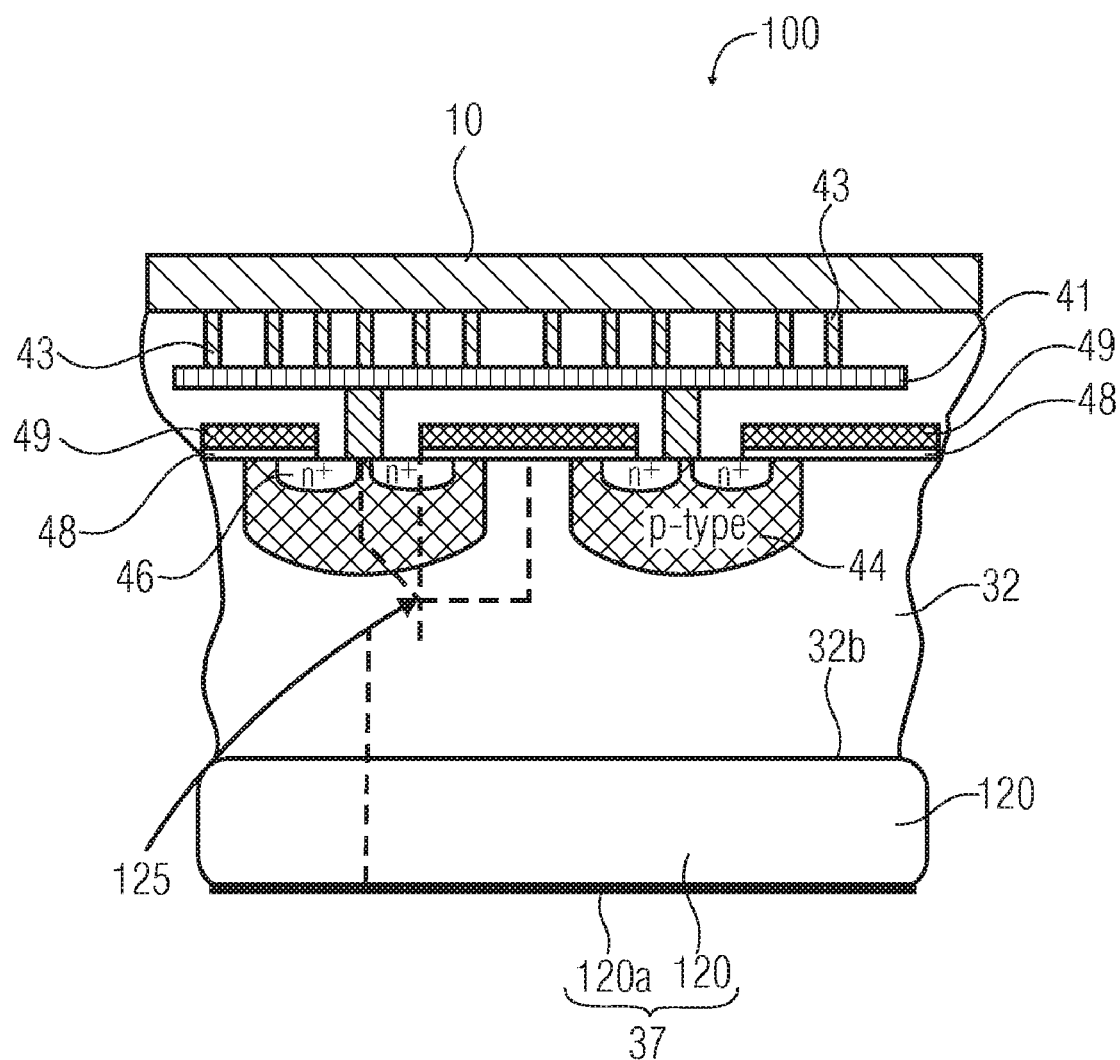
FIG. 11 illustrates a schematic cross-sectional view of an isolated-gate bipolar transistor (IGBT) according to another embodiment.

In another embodiment (FIG. 11) the semiconductor device 100 may be formed as an isolated gate bipolar transistor (IGBT). The IGBT power semiconductor device may have as described above a topmost metallization layer and an active area interrupted by an inactive area. The IGBT may differ from the DMOS power semiconductor devices described above by an additional dopant region 120 forming together with a contact zone 120a the drain terminal region 37. This drain terminal region may be connected to one part of the topmost metallization layer. The drain terminal region may be formed at a bottom side of the IGBT and the metallization layer 10 may be formed on the upper side of the IGBT. This additional dopant region includes a dopant with a conductivity type opposite to the conductivity type of the adjacent semiconductor substrate 32. Due to the opposite dopant, a pnp- or a npn-transistor structure 125 between the drain terminal region 37 and the source terminal region 35 is formed. In context with the bipolar transistor, the gate-, the source- and the drain terminal region may be also named emitter-, source- or basis-region. Such an isolated gate bipolar transistor structure 125 is schematically illustrated in FIG. 11. The additional dopant region 120 may be formed as a layer arranged at the second surface 32b or bottom side of the semiconductor substrate 32, at the underside of a semiconductor substrate 32, respectively. The remaining numeral references, as well as their arrangement are described in context with other figures above.

It is also possible to form the metallization layer 10 on the lower or bottom side of the IGBT. This refers to the semiconductor device 100 in general. This means, for example, the metallization layer 10 for the power semiconductor device, the NMOS, the PMOS, the super junction semiconductor device or the IGBT may be arranged on the lower or bottom side of the respective semiconductor device.

In a further embodiment, an electrical circuit 130 (FIG. 12) is described. An electrical circuit 130 may have a power semiconductor device 100 as described above, wherein the power semiconductor device 100 is configured to switch an inductive load 132, which can be represented by an inductance 132*a* and a resistor 132*b*. The inductive load 132 may be coupled to a first terminal region 100*a* of the power semiconductor device and a power supply 134. The second terminal region 100*b* of the power semiconductor device 100 may be connected to ground 140. The electrical circuit 130 includes at least one Zener diode 136 which is arranged between the first terminal region 100*a* and the controllable region 100*c* of the power semiconductor device. The Zener diode may be configured to protect the power semiconductor device 100 against an excess voltage during switching the inductive load 132. The inductive load may be connected in a so-called low-side configuration, as described above, or in a so-called high-side configuration, wherein the inductive load 132 is coupled with the second terminal region 100*b* of the power semiconductor device and ground 140. The Zener diode may break down if the voltage between the first terminal region 100*a* and the third terminal region 100*c*, the controllable region 100*c* exceeds a specified voltage value. This voltage value may be for example, 55 V. The Zener diode 136 may be configured in a back-to-back configuration, this means that two Zener diodes 136*a* and 136*b* are coupled to each other so that the point in opposite directions. Because of this, the Zener breakdown voltage applied to the electrical circuit has to be exceeded until current flows in either of the two directions.

The inductive load 132 may represent a magnetically driven actuator, an electromotor, a transformer having an iron core, an electro-generator or a coil having an inductance larger than 1 µH. The electrical circuit 130 may also be part of the switching unit 111 described in context with FIG. 11. The electrical circuit 130 may be, for example, formed at an output stage of the switching unit 111.

In one or more embodiments, the power semiconductor device as described above may include at least one inactive region, wherein the inactive region has only one, only two or none of the first and the second terminal region and the controllable region.

In further embodiments, the metallization layer above the active region on the upper surface of the power semiconductor device forms the topmost metallization layer of the power semiconductor device. The metallization layer may be formed as a power copper layer which is configured to dissipate heat caused by an electrical power dissipation of the active region of the power semiconductor device and to form a power supply layer for the power semiconductor device. The metallization layer may have a thickness larger than 2 µm.

In other embodiments, the power semiconductor device as described above may further have a contact layer between the metallization layer above the active region on the upper surface of the power semiconductor device and a main semiconductor substrate surface, wherein the contact layer includes at least a further metallization layer separated from the metallization layer and the main semiconductor substrate surface by at least one insulating layer. Furthermore the contact layer may include means configured to form a conductive path between the first or the second part of the metallization layer and the respective first or second terminal region or between the further metallization layer and the first or the second part of the metallization layer and the respective first or second terminal region. The metallization layer may be the topmost metallization layer of the power semiconductor device. The further metallization layer and the contact layer may be a conductive material different from the material of the metallization layer at the top of the power semiconductor device, which may be for example, copper.

In embodiments of the power semiconductor device as described above, the active region is formed as a DMOS transistor, wherein the first terminal region is formed as a source terminal region, the second terminal region is formed as a drain terminal region, and the controllable region is formed as a channel region controllable by a gate terminal arranged above the channel region and separated by a gate insulation layer, and wherein the inactive region is structured so that a drain source current is zero or reduced compared to a current in the active region of the DMOS. In embodiments of the power semiconductor device, the active region in the semiconductor substrate may have a first terminal region doped with a first type of dopant arranged in a body region which is formed in the semiconductor substrate and which is doped with a second type of dopant and a controllable region formed in the body region between the first terminal region and the second terminal region. The second terminal region is doped with the first type of dopant, and an inactive region has only one, only two or none of the first, the second terminal region or the controllable region.

In one or more embodiments described above, the controllable region includes a channel region separated by an insulating layer from an overlapping control terminal, the gate terminal region or gate electrode, and wherein the inactive region is formed by a missing channel region and/or a missing control terminal, gate electrode respectively. That means, in one or more embodiments the body region and therewith the channel region may be interrupted so that an inactive region in the power semiconductor device is formed.

As it is illustrated in FIG. 11, the power semiconductor device may be formed as an isolated gate bipolar transistor, wherein the second terminal region may be doped so that a bipolar transistor structure is formed between the source terminal region of the semiconductor substrate and the drain terminal region.

In one or more embodiments, a power semiconductor device as described above may have a plurality of active regions, wherein at least one active region is interrupted by an inactive region. The first and the second terminal region in the active regions may be arranged as well in parallel stripes, and the distance between the stripes of the first and second terminal region may be between 2 µm and 30 µm.

In one embodiment, a power semiconductor device with four or less parallel arranged active region stripes, all active regions include an inactive region. In other embodiments a power semiconductor device with five or more parallel arranged active region stripes, only the parallel arranged active regions in the center part of the device may have an inactive region.

According to one embodiment, all active regions of a power semiconductor device as described above may have an inactive region, if the semiconductor substrate area, on which the active regions are formed, is smaller than 0.5 mm$^2$.

According to a further embodiment, the power semiconductor device includes a plurality of active regions parallel arranged in stripes, wherein a contact layer between the metallization layer at the upper surface of the power semiconductor device and the main semiconductor substrate surface has at least a first metallization layer parallel arranged above the active region and electrically connected to the first terminal region in the semiconductor substrate and a second metallization layer parallel arranged to the active region and electrically connected to the second terminal region, and wherein the first and the second metallization layer are identical formed above the active and inactive regions of the power semiconductor device.

In one or more embodiments, the power semiconductor device may be formed as a lateral, vertical or trench DMOS transistor. The difference between the active region and the inactive region in the DMOS transistors may be a missing $n^+$-doped source contact zone forming the inactive region of the DMOS. As a consequence, there may be none or only a low current flux and therewith only a low electrical heat dissipation in the area of the missing $n^+$-doped contact zone.

The DMOS device may have an active region which is formed in an n-epitaxial semiconductor substrate with a p-doped body region, wherein the p-doped body region includes a $n^+$-doped source terminal region and a controllable channel region formed in the p-doped body region. The drain terminal region of the DMOS device may be $n^+$-doped and formed as an $n^+$-sinker or in an n-well zone in the n-epitaxial semiconductor substrate. In this embodiment in an inactive region the source terminal region is not $n^+$-doped and may therefore not have a n-type conductivity. But it is also possible that the source and the drain terminal region are not $n^+$-doped in the inactive region of the DMOS device according to another embodiment.

In the flow chart (FIG. 13), the method of manufacturing a semiconductor device according to one embodiment is described. The method involves producing 140 an active region in a semiconductor substrate having a first terminal region and a second terminal region, the active region being interrupted by an inactive region, wherein am electrical power dissipation in the inactive region is zero or smaller than a power dissipation in the active region. The method further involves applying a metallization layer 145 arranged with respect to the active region on a surface of the power semiconductor device and at least partly overlapping the active area, wherein the metallization layer is divided into a first part, in electrical contact to the first terminal region, and a second part, in electrical contact to the second terminal region, wherein the first and the second part are separated by a gap. Furthermore, the applying of the metallization 145 is performed so that the gap and the inactive region is mutually arranged so that therewith an electrical power dissipation below the gap is zero or reduced compared to an electrical power dissipation below the first and the second part of the metallization layer.

The producing 140 an active region can be performed so that the active region further includes a controllable region and wherein the inactive region include only one, two or none of the first and the second terminal region and the controllable region.

For producing 140 an active region as described above, a mask can be used, which contributes at a first area to the active region and at a second area to the inactive region, wherein the second area is complementary to the first area.

The producing 140 can be performed so that the active region and the inactive region are produced using the same mask.

In another embodiment of the method of manufacturing a semiconductor device, the producing of the active region which is interrupted by the inactive region comprehends a doping of the first and the second terminal region for forming active regions and none or only the doping of the first or the second terminal region for forming the inactive region.

Furthermore, it is also possible that the producing 140 is performed so that the inactive region has only one, two or none of the first and the second terminal region and the controllable region forming together the active region. This means that the producing 140 can be performed so that one of the parts, which are forming the active region—the first-, the second terminal region and the controllable region—is not formed and hence an inactive region is formed.

One or more embodiments described above illustrate that a heating in the gap region of the metallization layer on the upper surface of the power semiconductor device can be prevented or reduced and therefore a temperature swing as well as a temperature gradient of the power semiconductor device during operation reduced. The above-described embodiments illustrate as well a design rule and a design layout for forming the power semiconductor device according to one or more embodiments. By forming an inactive region, which is mutually arranged to the gap of the power metallization on the upper surface of the power semiconductor device as described in embodiments, the local power dissipation, the maximum temperature swing and the temperature gradient for the power semiconductor device can be reduced.

In further embodiments the semiconductor device may be formed as a bipolar npn- or pnp-transistor, wherein the first terminal region may correspond, for example, to the emitter terminal of the bipolar transistor, and the second terminal region may correspond to the collector terminal of the bipolar transistor. A controllable region, as described above may then correspond to the base terminal of a bipolar transistor.

While the semiconductor device of this invention and the method of manufacturing the same have been described in terms of embodiments, it will be apparent to those skilled in the art that variations may be applied to the semiconductor device and to the method without departing from the concept, the spirit and scope of the invention. All such similar substitutes and modifications apparent to those skilled in the art are deemed to be within the spirit, scope and concept of the disclosure as defined by the appended claims. In one embodiment, the conductivity type of the dopant described in the figures and embodiments can be exchanged by the corresponding opposite conductivity type dopant, without departing from the concept, the spirit and the scope of the invention.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    an active region in a semiconductor substrate comprising a first terminal region and a second terminal region, wherein the active region is interrupted by an inactive region, wherein an electrical power dissipation in the inactive region is zero or smaller than an electrical power dissipation in the active region; and a metallization layer arranged with respect to an active region on a surface of the semiconductor device and at least partly overlapping the active area, wherein the metallization layer is divided into a first part, in electrical contact to the first terminal region, and a second part, in electrical contact to the second terminal region, wherein the first and the second part are separated by a gap; and wherein the gap and the inactive region are mutually arranged so that an electrical power dissipation below the gap is reduced compared to an electrical power dissipation below the first part and the second part of the metallization layer.

2. The semiconductor device of claim 1, wherein the gap and the inactive region are mutually arranged so that the gap and the inactive region at least partly overlap.

3. The semiconductor device of claim 1, wherein the active region further comprises a controllable region and wherein the inactive region comprises only one, only two or none of the first and the second terminal region and the controllable region.

4. The semiconductor device of claim 1, wherein the metallization layer is configured to dissipate heat caused by an electrical power dissipation of the active region and to form a power supply layer for the first and the second terminal region.

5. The semiconductor device of claim 1, wherein the metallization layer comprises a thickness larger than 2 μm.

6. The semiconductor device of claim 1, further comprising a contact layer between the metallization layer above the active region on the upper surface of the power semiconductor device and a main semiconductor substrate surface, wherein the contact layer comprises at least a further metallization layer separated from the metallization layer and the main semiconductor substrate surface by at least one insulating layer and means configured to form a conductive path between the first or the second part of the metallization layer and the respective first or second terminal region or between the further metallization layer and the first or the second part of the metallization layer and the respective first or second terminal region; and wherein the metallization layer is the topmost metallization layer of the semiconductor device.

7. The semiconductor device of claim 6, wherein the metallization layer comprises copper and the at least further metallization layer comprises copper or another metal.

8. The semiconductor device of claim 1, wherein the active region is formed as a DMOS transistor with the first terminal region formed as a source terminal region, the second terminal region formed as a drain terminal region and a controllable region formed as a channel region controllable by a gate terminal arranged above the channel region and separated by a gate insulation layer, and wherein the inactive region is structured so that a drain-source current is zero or reduced compared to the DMOS in the active region.

9. The semiconductor device of claim 1, wherein the active region in the semiconductor substrate comprises a first terminal region, doped with a first type of dopant, arranged in a body region, which is formed in the semiconductor substrate and which is doped with a second type of dopant, and a controllable region formed in the body region, between the first terminal region and the second terminal region, which is formed in the semiconductor substrate and which is doped with the first type of dopant; and wherein the inactive region comprises none or only one of the first or the second terminal region doped with the first type of dopant.

10. The semiconductor device of claim 1, formed as an isolated gate bipolar transistor (IGBT), a PMOS, a NMOS or a super junction semiconductor device; wherein the active region in the semiconductor substrate comprises a first terminal region doped with a first type of dopant, arranged in a body region, which is formed in the semiconductor substrate and which is doped with a second type of dopant, and a controllable region formed in the body region between the first terminal region and the second terminal region, which is doped with the second type of dopant, so that a bipolar transistor structure is formed between the body region, the semiconductor substrate and the drain terminal region.

11. The semiconductor device of claim 1, comprising a plurality of active regions, wherein at least one active region is interrupted by an inactive region and wherein the metallization layer is arranged above the plurality of active regions and the first part of the metallization layer is in electrical contact with the first terminal region and the second part of the metallization layer is in electrical contact to the second terminal region of the plurality of active regions.

12. The semiconductor device of claim 1, wherein the active region comprises a plurality of point-shaped islands in the semiconductor substrate forming the first or the second terminal region, and wherein the inactive regions comprise none or a less density of point-shaped islands compared to active regions.

13. The semiconductor device of claim 1, comprising a plurality of active regions parallel arranged in stripes, wherein a contact layer between the metallization layer and a main semiconductor substrate surface comprise at least a first metallization layer parallel arranged above the active regions and electrically connected to the first terminal regions, and a second metallization layer parallel arranged to the active regions and electrically connected to the second terminal region, and wherein the first and the second metallization layer are identical above the active and the inactive regions.

14. The semiconductor device of claim 1, wherein the active region comprises a plurality of parallel arranged stripes, arranged in an array, the array having outer stripes and inner stripes, wherein at least one stripe of the outer stripes does not have an inactive region and wherein at least one of the inner stripes has an inactive region.

15. The semiconductor device of claim 1 configured as an electrical circuit, wherein the semiconductor device is configured to switch an inductive load, coupled to a first terminal region and to a power supply; wherein the second terminal region is coupled to ground; and wherein at least one Zener diode is arranged between the first terminal region and a controllable region and configured to protect the semiconductor device against an excess voltage during switching the inductive load; and wherein the inductive load comprises a magnetically driven actuator, an electromotor, a transformer having an iron core, an electro-generator, or a coil having an inductance larger than 1 μH.

16. The semiconductor device of claim 1 configured as switching unit comprising logic circuitries and a plurality of semiconductor devices, wherein each of the semiconductor devices comprises a power supply line bonded to the metallization layer of the semiconductor device, and wherein the switching unit with the semiconductor devices is configured to switch an application coupled to the switching unit.

17. A semiconductor device, comprising:
a semiconductor substrate;
an active region in the semiconductor substrate and comprising a first terminal region and a second terminal region;
an inactive region interrupting the active region and configured such that an electrical power dissipation in the inactive region is zero or smaller than an electrical power dissipation in the active region;

a metallization layer on a surface of the semiconductor device and at least partly overlapping the active area, the metallization layer including a first part and second part separated by a gap;

wherein the first part is in electrical contact to the first terminal region, and the second part is in electrical contact to the second terminal region; and means for reducing an electrical power dissipation below the gap compared to an electrical power dissipation below the first part and the second part of the metallization layer.

18. A DMOS device comprising:

an active region in a semiconductor substrate of a first conductivity type with a body zone of a second conductivity type, comprising a source terminal region of the first conductivity type and a controllable channel region formed in the body zone and a drain terminal region of the first conductivity type in the semiconductor substrate, wherein the active region is interrupted by an inactive region with a reduced or non-electrical power dissipation compared to a power dissipation in the active region; and a metallization layer for heat dissipation caused by the active region and for the power supply of the active region, arranged above the active region on the upper surface of the DMOS device and at least partly overlapping the active area, wherein the metallization layer is divided into a first part, in electrical contact to the source terminal region, and a second part, in electrical contact to the drain terminal region, wherein the first and the second part are separated by a gap; and wherein the gap and the inactive region are mutually arranged so that an electrical power dissipation below the gap is reduced compared to a power dissipation below the first part and the second part of the metallization layer.

19. The DMOS device of claim 18, wherein the active region is formed in an n-doped semiconductor substrate with a p-doped body zone, wherein the p-doped body zone comprises a n+-doped source terminal region and a controllable channel region formed in the p-doped body region and a n+-doped drain terminal region formed as a n-sinker or in an n-well zone in the n-doped semiconductor substrate, and wherein in an inactive region the source or the drain terminal region is not n+-doped.

20. A method of manufacturing a semiconductor device, comprising:

producing an active region in a semiconductor substrate comprising a first terminal region and a second terminal region, the active region being interrupted by an inactive region, wherein an electrical power dissipation in the inactive region is zero or smaller than a power dissipation in the active region; and applying a metallization layer arranged with respect to an active region on a surface of the semiconductor device and at least partly overlapping the active area, wherein the metallization layer is divided into a first part, in electrical contact to the first terminal region, and a second part, in electrical contact to the second terminal region, wherein the first and the second part are separated by a gap; and wherein the applying is performed so that the gap and the inactive region is mutually arranged so that therewith an electrical power dissipation below the gap is reduced compared to an electrical power dissipation below the first and the second part of the metallization layer.

21. The method of claim 20, wherein masks are used in the step of producing, and a mask is used, which contributes at a first area to the active region and at a second area to the inactive region, wherein the second area is complementary to the first area.

22. The method of claim 21, wherein the active region and the inactive region are produced using the same mask.

23. The method of claim 20, wherein the producing of the active region comprises a doping of the first and the second terminal region for forming active regions and none or only a doping of the first or the second terminal region for forming the inactive region.

24. The method of claim 20, wherein the producing is performed so that the active region further comprises a controllable region and wherein the inactive region comprise only one, two or none of the first and the second terminal region and the controllable region.

* * * * *